United States Patent
Nakashiba

(12) 
(10) Patent No.: US 6,417,531 B1
(45) Date of Patent: Jul. 9, 2002

(54) CHARGE TRANSFER DEVICE WITH FINAL POTENTIAL WELL CLOSE TO FLOATING DIFFUSION REGION

(75) Inventor: Yasutaka Nakashiba, Tokyo (JP)

(73) Assignee: NEC Corporation (JP)

(*) Notice: Subject to any disclaimer, the term of this patent is extended or adjusted under 35 U.S.C. 154(b) by 0 days.

(21) Appl. No.: 09/427,977

(22) Filed: Oct. 27, 1999

(30) Foreign Application Priority Data

Nov. 24, 1998 (JP) ............................................. 10-332777

(51) Int. Cl.[7] ..................... H01L 29/768; H01L 31/109; H01L 21/00; H01L 21/339
(52) U.S. Cl. ..................... 257/215; 257/251; 257/912; 257/238; 257/239; 257/219; 257/229; 257/246; 257/248; 257/183.1; 257/231; 438/75; 438/144; 438/148
(58) Field of Search ............................. 257/215, 183.1, 257/251, 912, 238, 239, 219, 229, 231, 246, 248; 438/75, 144, 148

(56) References Cited

U.S. PATENT DOCUMENTS

| | | | | |
|---|---|---|---|---|
| 5,103,278 A | * | 4/1992 | Miwada | 357/24 |
| 5,239,192 A | * | 8/1993 | Hirota | 257/239 |
| 5,521,405 A | * | 5/1996 | Nakasiba | 257/248 |
| 5,650,644 A | * | 7/1997 | Funakoshi et al. | 257/240 |

FOREIGN PATENT DOCUMENTS

| | | | | |
|---|---|---|---|---|
| JP | 363076375 A | * | 4/1988 | |
| JP | 64-14966 | | 1/1989 | ........... H01L/29/76 |
| JP | 01033966 A | * | 2/1989 | |
| JP | 4-5835 | | 1/1992 | ......... H01L/21/339 |

OTHER PUBLICATIONS

"An Overlapping Electrode Buried Channel CCD" Erb et al IEDM Technical Digest, 1973, pp. 24–26.
"Two–Phase Charge Coupled Linear Imaging Devices with Self–Aligned Implanted Barrier" Kim; IEDM Technical Digest, 1974; p. 55.

* cited by examiner

Primary Examiner—Stephen D. Meier
Assistant Examiner—James Mitchell
(74) Attorney, Agent, or Firm—Hayes Soloway

(57) ABSTRACT

A charge transfer device has a charge transfer region under charge transfer electrodes for stepwise conveying charge packets through potential wells to a floating diffusion region, and the charge transfer region has a boundary sub-region contracting toward the floating diffusion region, wherein the final potential well is created at a certain portion in said boundary sub-region close to the floating diffusion region so that each charge packet travels over a short distance, thereby enhancing a charge transfer efficiency.

30 Claims, 25 Drawing Sheets

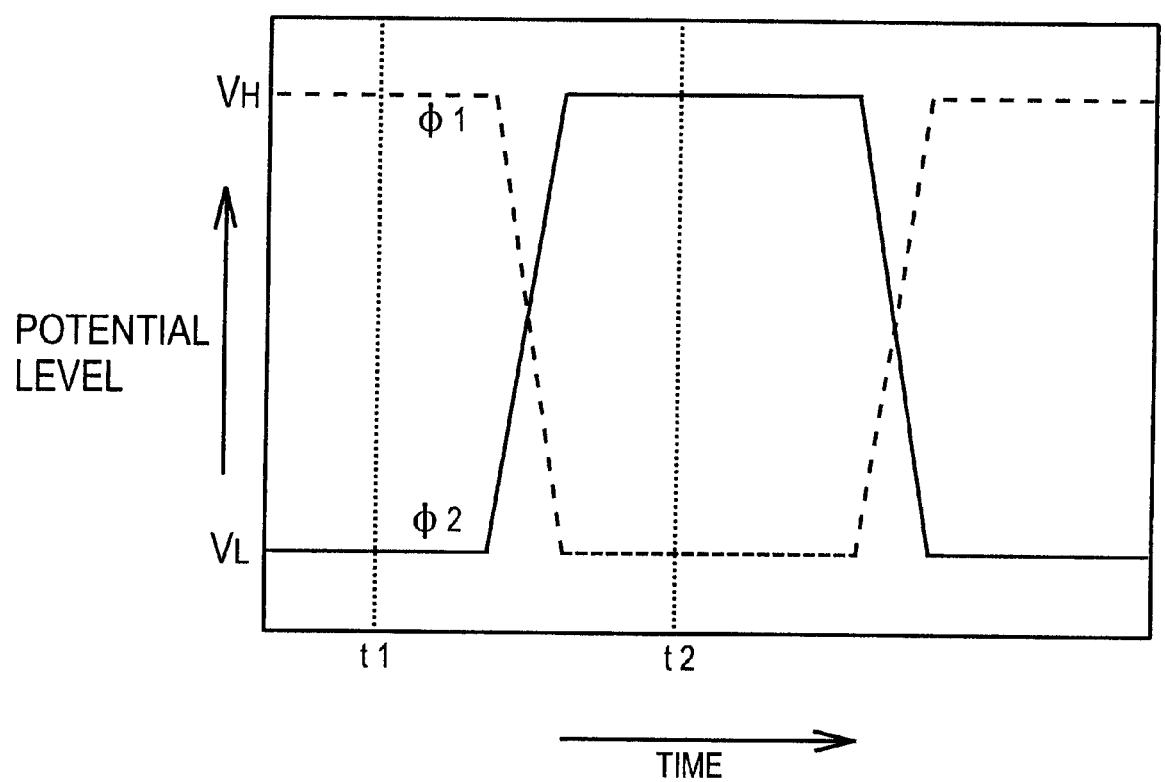

CHARGE TRANSFER DEVICE WITH FINAL POTENTIAL WELL CLOSE TO FLOATING DIFFUSION REGION

FIELD OF THE INVENTION

This invention relates to a charge transfer device and, more particularly, to a charge transfer device with a floating diffusion amplifier.

DESCRIPTION OF THE RELATED ART

A typical example of the charge transfer device is disclosed in IEDM Technical Digest, 1973, page 24 and IEDM Technical Digest, 1974, page 55. FIGS. 1 and 2 illustrate the prior art charge transfer device. The prior art charge transfer device is fabricated on a p-type semiconductor substrate 101. In a major surface portion of the p-type semiconductor substrate 101 are formed lightly-doped n-type impurity regions 102 and n-type impurity regions 103 which are alternated with one another. The rightmost n-type impurity region is decreased in width, and is contiguous to the rightmost lightly-doped n-type impurity region. An n-type floating diffusion region 112 is provided between the rightmost lightly-doped n-type impurity region and a heavily-doped n-type impurity region 104. A heavily-doped p-type impurity region 105 surrounds the above-described n-type impurity regions 102/103/104 and the n-type floating diffusion region 112.

The major surface of the p-type semiconductor substrate 101 is covered with an insulating layer 106, and charge transfer electrodes 107a/107b/207a and 108a/108b/208a are electrically isolated from one another in the insulating layer 106. In order to make the charge transfer electrodes 107a/107b/207a/108a/108b/208a clear, any hatching line is not drawn in the cross section of the insulating layer 106 shown in FIG. 2.

The charge transfer electrodes 107a/107b/207a are respectively provided over the n-type impurity regions 103, and the charge transfer electrodes 108a/108b are provided over the lightly doped n-type impurity regions 102. The charge transfer electrodes 107a/107b/207a are partially overlapped with the charge transfer electrodes 108a/108b. A gate electrode 109 is provided over the rightmost lightly-doped n-type impurity region.

A clock signal $\Phi 1$ is supplied from a metal line 111 to the charge transfer electrodes 107a/108a/207a/208a, and a clock signal $\Phi 2$ is supplied to the charge transfer electrodes 107b/108b. A constant voltage VOG is supplied to the gate electrode 109. Thus, the charge transfer electrodes 107a, 207a and 107b are respectively paired with the adjacent charge transfer electrodes 108a, 208a and 108b, and the clock signals $\Phi 1$ and $\Phi 2$ are selectively supplied to the charge transfer electrode pairs 107a/108a, 207a/208a and 107b/108b.

A gate electrode 110 is provided over the lightly-doped n-type impurity region between the floating diffusion region 112 and the heavily-doped n-type impurity region 104. A reset signal $\Phi R$ is supplied to the gate electrode 110, and the floating diffusion region 112 is connected to an output circuit (not shown). The output circuit is implemented by a source follower, and the source follower achieves the impedance conversion.

FIGS. 3A, 3B and 3C illustrate potential wells created in the prior art charge transfer device during a charge transfer. Firstly, the reset signal $\Phi R$ is applied to the gate electrode 110. Then, the potential barrier is removed from the lightly-doped n-type region under the gate electrode 110 as shown in FIG. 3A, and electric charge flows from the floating diffusion region 112 to the heavily-doped n-type impurity region 104. As a result, the floating diffusion region 112 becomes equal to the reset voltage VR. The clock signal $\Phi 1$ is in the high level VH, and the other clock signal $\Phi 2$ is in the low level VL (see FIG. 4). Charge packets e1 and e2 are accumulated in the potential well under the charge transfer electrode 208a and in the potential well under the charge transfer electrode 108a, respectively.

Subsequently, the reset signal $\Phi R$ is removed from the gate electrode 110, and the potential barrier separates the floating diffusion region 112 from the heavily-doped n-type impurity region 104. The clock signals $\Phi 1$ and $\Phi 2$ are maintained at time t1, and the charge packets e1 and e2 are still accumulated in the potential well under the charge transfer electrode 208a and in the potential well under the charge transfer electrode 108a, respectively.

The clock signals $\Phi 1$ and $\Phi 2$ are respectively changed to the low level VL and the high level VH at time t2. Then, the potential well is created under the leftmost charge transfer electrode 108b, and a charge packet e3 flows into the potential well. The potential barrier is removed from the lightly-doped n-type impurity region under the charge transfer electrode 107b, and a potential well is created in the n-type impurity region under the charge transfer electrode 108b. Then, the charge packet e2 flows into the potential well in the n-type impurity region under the charge transfer electrode 108b as shown in FIG. 3C. Moreover, the bottom of the potential well under the charge transfer electrode 208a exceeds the potential barrier in the rightmost lightly-doped n-type impurity region under the gate electrode 109, and the charge packet e1 flows into the floating diffusion region 112.

The charge packet e1 varies the potential level in the floating diffusion region 112, and the potential variation is detected by the output circuit. The output circuit produces an output signal, the voltage level V of which is given as $$V = Q/C \times G$$

where Q is the amount of charge of the charge packet e1, C is a capacitance coupled to the floating diffusion 112 and G is a voltage gain. Finally, the reset signal VR is applied to the gate electrode 110, again, and the potential barrier is removed from the lightly-doped n-type impurity region under the gate electrode 110. The floating diffusion region 112 is reset to the reset voltage VR. Thus, the charge packets e1, e2 and e3 are stepwise transferred to the floating diffusion region 112, and the output circuit produces the output signal from the potential variation in the floating diffusion region 112.

It is desirable to widely vary the potential level V of the output signal. As will be understood from the above equation, the smaller the capacitance C, the wider the variation of the potential level V. For this reason, the floating diffusion region 112 is much narrower than the n-type impurity regions 103 and 102 (compare the channel width W with the channel width W' FIG. 1). This is the reason the rightmost n-type impurity region contracts toward the rightmost lightly-doped n-type impurity region. As a result, the charge transfer electrode 208a has length L' longer than length L of the other charge transfer electrodes 108a and 108b, and signal charge accumulated around the oblique side lines flows over length L" greater than length L'.

As described hereinbefore, the charge packets e1, e2 and e3 are transferred from the potential well to the next potential well in response to the clock signals $\Phi 1$ and $\Phi 2$. While the clock signal Φ2 is staying at the high level VH, the charge packets are transferred from the potential well to the next potential well. When the clock signal Φ2 is recovered from the low level VL to the high level VH, the potential well is isolated from the next potential well, and the charge transfer is completed. If the clock signal Φ2 stays at the high level VH for a sufficiently long time, the charge packet is perfectly transferred to the next potential well without any residual charge. However, a high-speed charge transfer is required for a high-dense image pick-up device. As described hereinbefore, the signal charge in the central area of the leftmost n-type impurity region is moved over the length L', and the signal charge in the peripheral area is moved over the length L". The signal charge in the peripheral area is imperfectly transferred to the floating diffusion region 112, and residual signal charge is left in the potential well under the charge transfer electrode 208a. This results in a low charge transfer efficiency. When the prior art charge transfer device transfers a small amount of charge packet, the low charge transfer efficiency is serious.

SUMMARY OF THE INVENTION

It is therefore an important object of the present invention to provide a charge transfer device, which is improved in charge transfer efficiency.

To accomplish the object, the present invention proposes to create the final potential well closer to a floating diffusion region than other potential wells.

In accordance with one aspect of the present invention, there is provided a charge transfer device for conveying charge packets comprising a floating diffusion region having a first width and varied in potential level depending upon the amount of electric charge forming each of the charge packets, a charge transfer region including a transfer sub-region having a second width greater than the first width and a boundary sub-region contiguous to the floating diffusion region and decreased from the second width to the first width, plural charge transfer electrodes capacitively coupled to the transfer sub-region so as to create potential wells and potential barriers between the potential wells in the transfer sub-region and responsive to a driving signal for stepwise conveying the charge packets through the potential wells and a final charge transfer electrode capacitively coupled to the boundary sub-region so as to create a final potential well at a position in the boundary sub-region closer to the floating diffusion region than the remaining positions in the boundary sub-region and responsive to the driving signal for successively transferring the charge packets from one of the potential wells through the final potential well to the floating diffusion region.

BRIEF DESCRIPTION OF THE DRAWINGS

The features and advantages of the charge transfer device will be more clearly understood from the following description taken in conjunction with the accompanying drawings in which:

FIG. 4 is a graph showing the waveforms of the clock signals selectively applied to the charge transfer electrodes of the prior art charge transfer device;

DESCRIPTION OF THE PREFERRED EMBODIMENTS

First Embodiment

Figure 1:
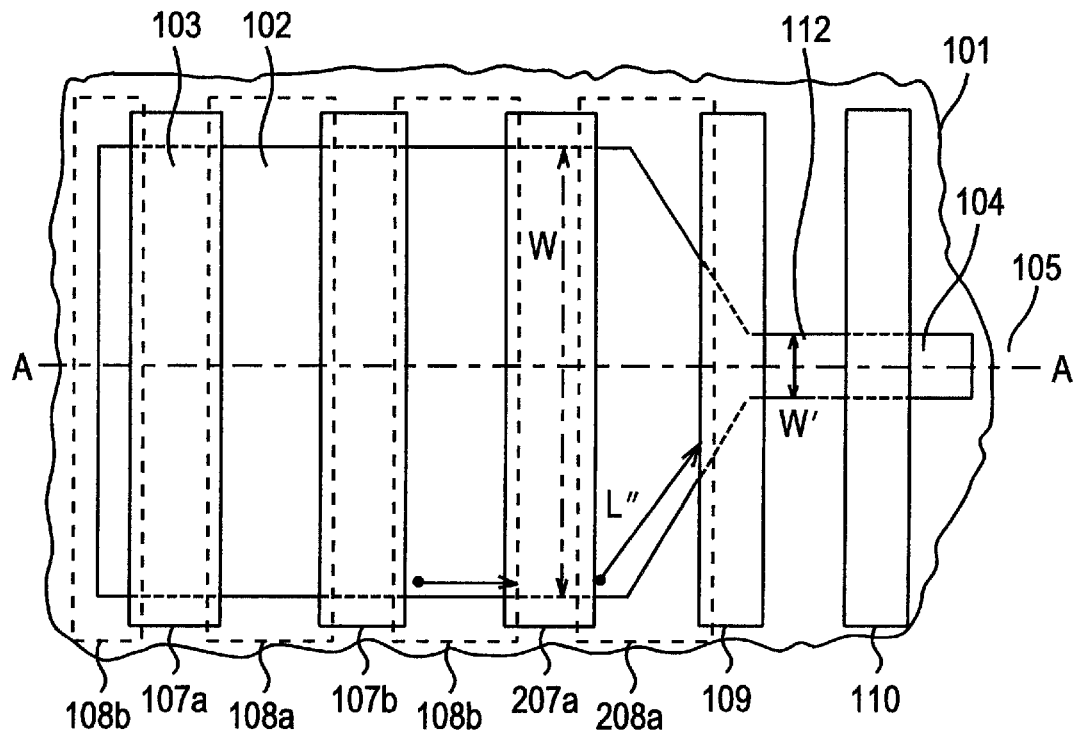
FIG. 1 is a plan view showing the prior art charge transfer device.
Figure 2:
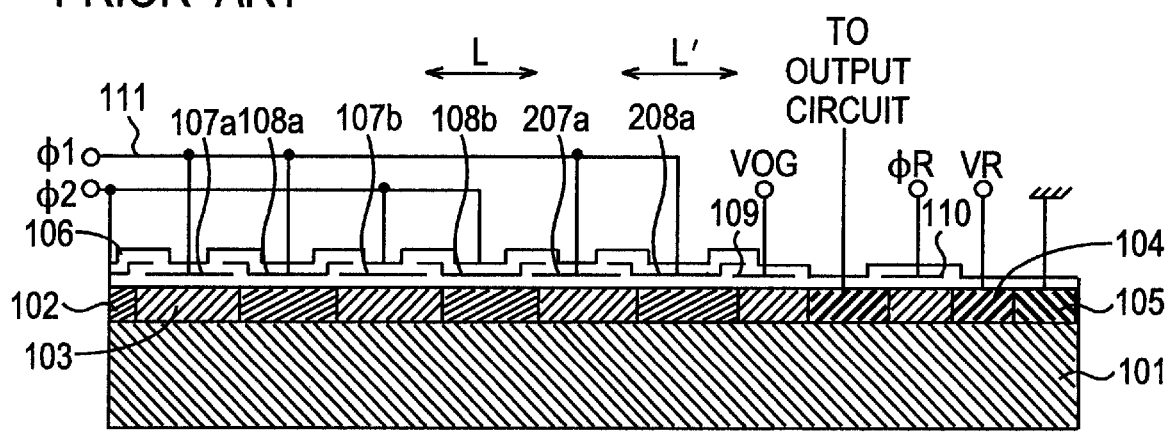
FIG. 2 is a cross sectional view taken along line A—A of FIG. 1 and showing the structure of the prior art charge transfer device.
Figure 3A:
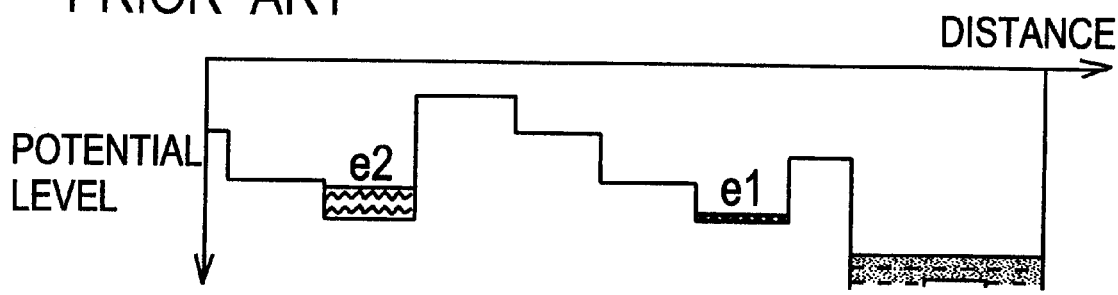
FIGS. 3A to 3C are graphs showing the potential wells varied during the transfer of the charge packets.
Figure 3B:
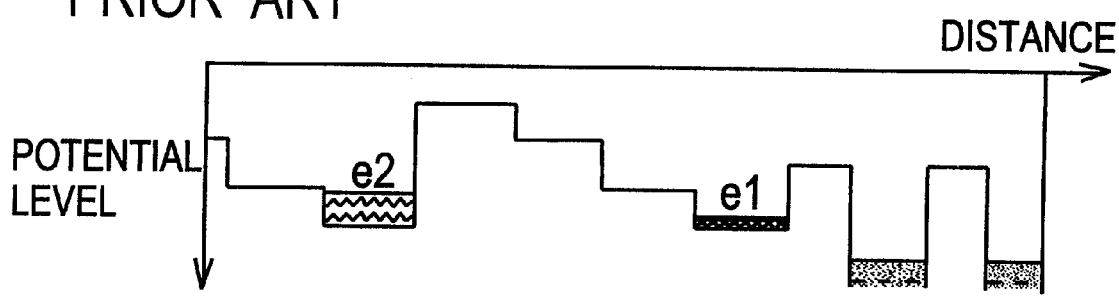
Figure 3C:
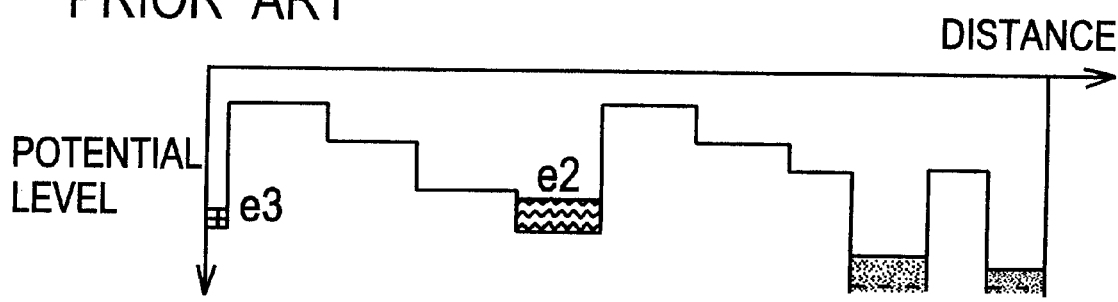
Figure 5:
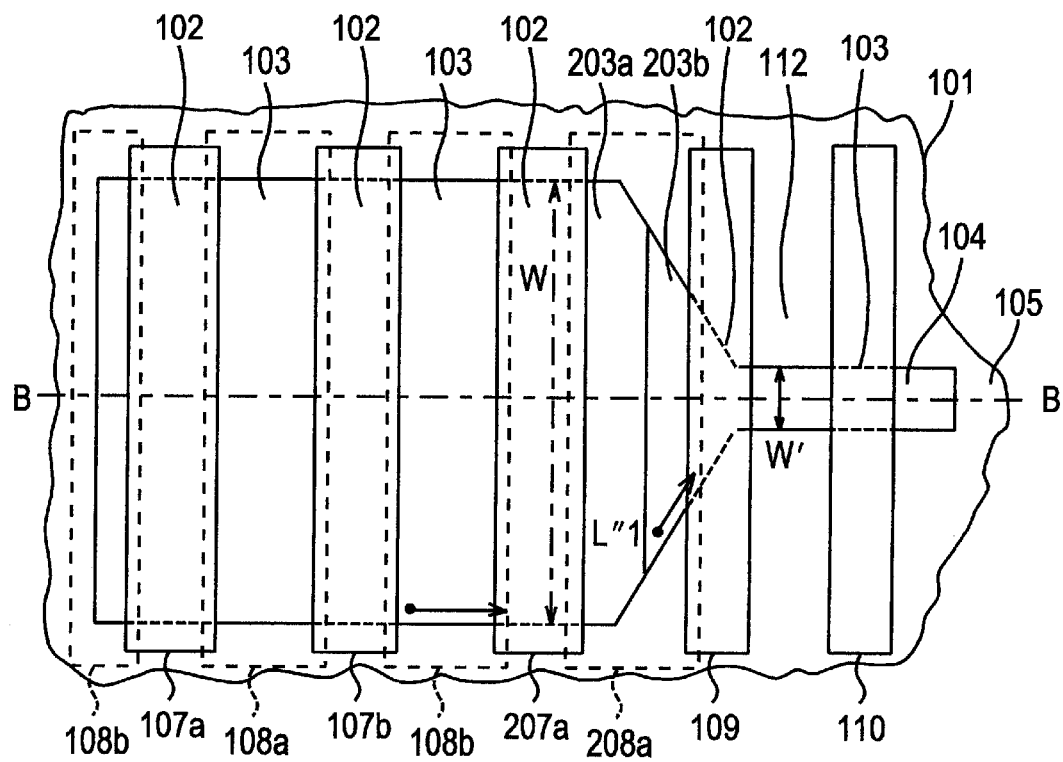
FIG. 5 is a plan view showing a charge transfer device according to the present invention.
Figure 6:
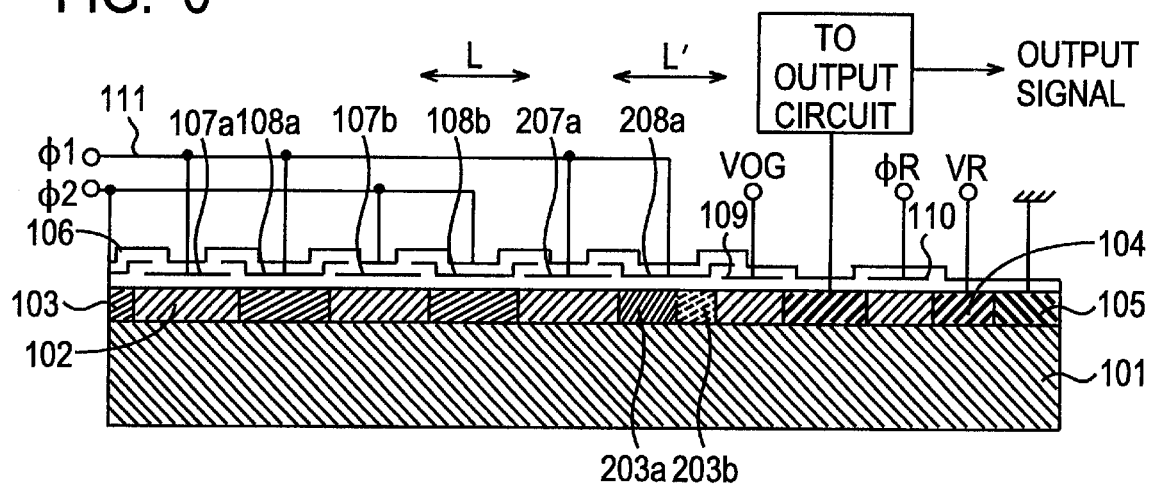
FIG. 6 is a cross sectional view taken along line B—B of FIG. 5 and showing the structure of the charge transfer device.

Referring to FIGS. 5 and 6 of the drawings, a charge transfer device embodying the present invention is fabricated on a p-type semiconductor substrate 101. An n-type charge transfer region is formed in a major surface portion of the p-type semiconductor substrate 101. Lightly-doped n-type impurity regions 102 and n-type impurity regions 103 are alternated with one another in the n-type charge transfer region, and the n-type impurity regions 103 are larger in dopant concentration than the lightly-doped n-type impurity regions 102. The left portion of the n-type charge transfer region contracts toward an n-type floating diffusion region 112, and the n-type floating diffusion region 112 is contiguous to a heavily-doped n-type drain region 104. The n-type charge transfer region has width W, and the n-type floating diffusion region 112 and the heavily-doped n-type drain region 104 have width W'. The width W is greater than the width W'. A heavily-doped p-type impurity region 105 is formed around the n-type charge transfer region, the n-type floating diffusion region 112 and the heavily-doped n-type drain region 104, and forms a p-n junction so as to electrically isolate the n-type charge transfer region, the n-type floating diffusion region 112 and the heavily-doped n-type drain region 104. The left portion of the charge transfer region has two n-type impurity sub-regions 203a and 203b. The n-type impurity sub-region 203b is larger in dopant concentration than the n-type impurity sub-region 203a. As will be described hereinlater, potential wells are created in the n-type impurity regions 108a/108b and the n-type impurity sub-region 203b. Potential barriers are created in and removed from the lightly-doped n-type impurity regions 102. Although the n-type impurity sub-region 203a is provided between the lightly-doped n-type impurity region 102 and the n-type impurity sub-region 203b, a charge packet is accumulated in the potential well created in the n-type impurity sub-region 203b, because the n-type impurity sub-region 203b has the bottom edge of the conduction band deeper than the bottom edge of the conduction band in the other n-type impurity sub-region 203a.

In this instance, the p-type semiconductor substrate 101 is doped at 1E15 cm$^{-3}$, and the heavily-doped p-type impurity region 105 has the dopant concentration of 1E18 cm$^{-3}$. The lightly-doped n-type impurity regions 102 are doped at 8E16 cm$^{-3}$, and the dopant concentration of the n-type impurity regions 103 are 1E17 cm$^{-3}$. The n-type impurity sub-region 203a has the dopant concentration of 9E16 cm$^{-3}$, and the other n-type impurity sub-region 203b is doped at 1E17 cm$^{-3}$. The heavily-doped n-type drain region 104 has the dopant concentration of 1E19 cm$^{-3}$. Thus, the heavily-doped n-type drain region 104 has the largest dopant concentration, and the lightly-doped n-type impurity regions 102 are smallest in dopant concentration. The n-type impurity sub-region 203a is larger in dopant concentration than the lightly-doped n-type impurity regions 102, but is smaller in dopant concentration than the n-type impurity regions 103. The other n-type impurity sub-region 203b is larger in dopant concentration than the n-type impurity regions 103, but is smaller in dopant concentration than the heavily-doped n-type drain region 104.

The major surface of the p-type semiconductor substrate 101 is covered with an insulating layer 106, and charge transfer electrodes 107a/107b/207a and 108a/108b/208a are formed in the insulating layer 106. The charge transfer electrodes 107a, 107b and 207a are partially overlapped with the charge transfer electrodes 108a/108b/208a, and the insulating layer 106 electrically isolates the charge transfer electrodes 107a, 108a, 107b, 108b, 207a and 208a from one another. In order to make the charge transfer electrodes 107a/107b/207a/108a/108b/208a clear, any hatching line is drawn in the cross section of the insulating layer 106 shown in FIG. 6.

The charge transfer electrodes 107a, 107b and 207a are provided over the lightly-doped n-type impurity regions 102, respectively, and the charge transfer electrodes 108a and 108b are provided over the n-type impurity regions 103, respectively. The charge transfer electrode 208a is provided over a left portion of the lightly-doped n-type impurity region 102 and the n-type impurity sub-regions 203a/203b. The charge transfer electrodes 107a, 108a, 207a and 208a are connected to a signal line 111, and a clock signal Φ1 is supplied through the signal line 111 to the charge transfer electrodes 107a, 108a, 207a and 208a. On the other hand, a clock signal Φ2 is supplied to the charge transfer electrodes 107b and 108b, and is 180 degrees different in phase from the clock signal Φ1.

Figure 7A:
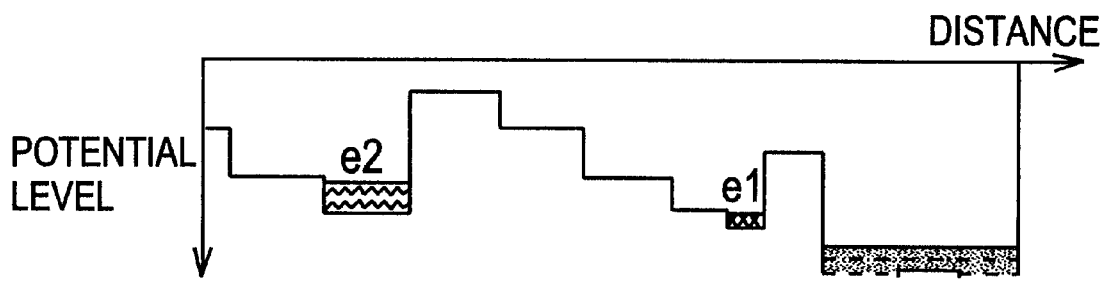
FIGS. 7A to 7C are graphs showing potential wells varied during the transfer of charge packets.

A gate electrode 109 is further provided over the lightly-doped n-type impurity region 102 in the leftmost portion of the n-type charge transfer region, and another gate electrode 110 is provided over the n-type impurity region 103 between the n-type floating diffusion region 112 and the heavily-doped n-type drain region 104. A constant voltage VOG is applied to the gate electrode 109, and a reset pulse signal ΦR is supplied to the other gate electrode 110. The heavily-doped n-type drain region 104 is connected to a reset voltage VR, and the n-type floating diffusion region 112 is connected to an output circuit. The output circuit has a source-follower circuit, and achieves an impedance conversion. The output circuit produces an output signal from variation of potential level in the floating diffusion region 112. Description is made on a charge transfer to the floating diffusion region 112 with reference to FIGS. 7A to 7C. First, the reset pulse signal ΦR is applied to the gate electrode 110, and removes the potential barrier from the n-type impurity region 103 as shown in FIG. 7A. Signal charge flows from the floating diffusion region 112 to the heavily-doped n-type drain region 104, and the floating diffusion region 112 is reset to the reset voltage VR. The clock signal Φ1 is staying at a high level, and the other clock signal Φ2 is in the low level. The potential wells are created in the n-type impurity regions 108a and 203b, and charge packets e2 and e1 are accumulated in the potential wells, respectively. The potential barrier separates the potential wells from one another.

Figure 7B:
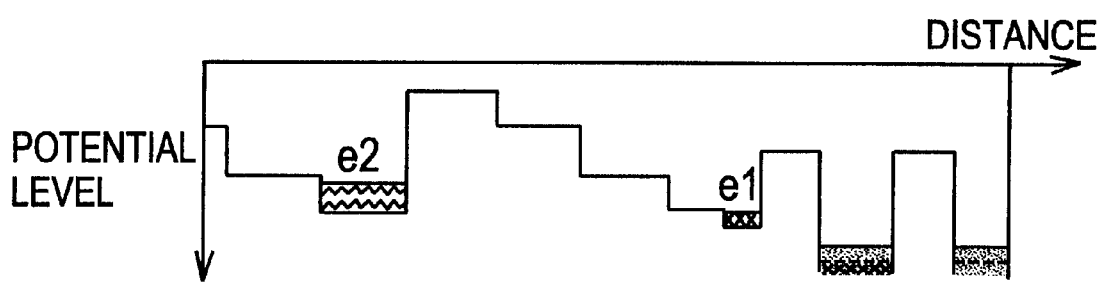

Subsequently, the reset pulse signal ΦR is removed from the gate electrode 110, and the potential barrier is created in the n-type impurity region 103 between the floating diffusion region 112 and the heavily-doped n-type drain region 104 as shown in FIG. 7B. As a result, the floating diffusion region 112 is electrically isolated from the heavily-doped n-type drain region 104. The clock signal Φ1 and the other clock signal Φ2 are still in the high level and the low level, respectively, and the charge packets e2 and e1 remain in the potential well in the n-type impurity region 103 under the charge transfer electrode 108a and in the n-type impurity sub-region 203b under the charge transfer electrode 208a.

Figure 7C:
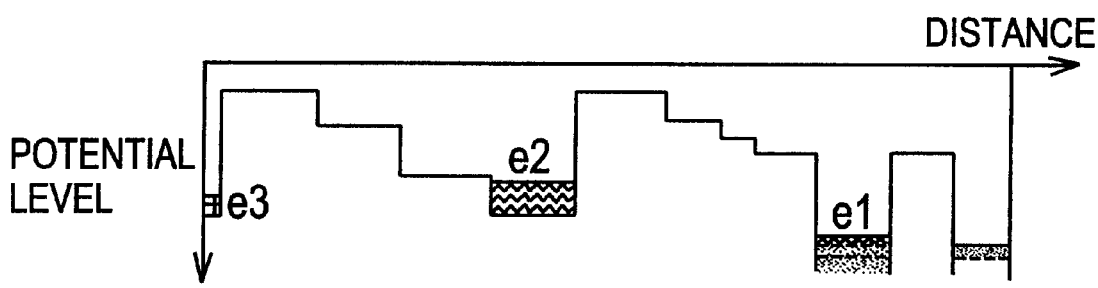

Subsequently, the clock signal Φ1 is changed to the low level, and the other clock signal Φ2 is changed to the high level. The clock signal Φ1 causes the potential well in the n-type impurity sub-region 203b to exceed the potential barrier in the lightly-doped n-type impurity region 102 under the gate electrode 109, and the charge packet e1 flows into the floating diffusion region 112 as shown in FIG. 7C. The charge packet e1 varies the potential level in the floating diffusion region 112, and the output circuit varies the potential level of the output signal.

The charge packet e1 is accumulated in the potential well created in the n-type impurity sub-region 203b, only. In other words, the charge packet e1 is never accumulated in the other n-type impurity sub-region 203a. The charge packet e1 flows over length L"1 less than the length L". For this reason, the charge packet e1 is transferred to the floating diffusion region 112 almost perfectly, and residual signal charge is ignorable. Thus, the charge transfer device according to the present invention enhances the charge transfer efficiency.

The clock signal Φ2 creates a potential well in the n-type impurity region 103 under the charge transfer electrode 108b, and removes the potential barrier from the lightly-doped n-type impurity region 102 under the charge transfer electrode 107b. The clock signals Φ1 and Φ2 make the potential well in the n-type impurity region 103 under the charge transfer electrode 108b deeper than the potential well in the n-type impurity region 103 under the charge transfer electrode 108a. Then, the charge packet e2 flows into the potential well in the n-type impurity region 103 under the charge transfer electrode 108b. Similarly, the clock signal Φ2 creates a potential well in the n-type impurity region 103 under the rightmost charge transfer electrode 108b, and a charge packet e3 flows into the potential well. Thus, the reset pulse signal ΦR, the clock signal Φ1 and the clock signal Φ2 are sequentially changed in such a manner as to transfer the charge packets e1, e2, e3, . . . through the potential wells to the floating diffusion region 112.

As will be appreciated from the foregoing description, the n-type impurity sub-region 203b creates the potential well close to the floating diffusion region 112, and decreases the distance to travel from L" to L"1. As a result, the charge packet is transferred to the floating diffusion region 112 without residual signal charge. This results in a high charge transfer efficiency.

Second Embodiment

Figure 8:
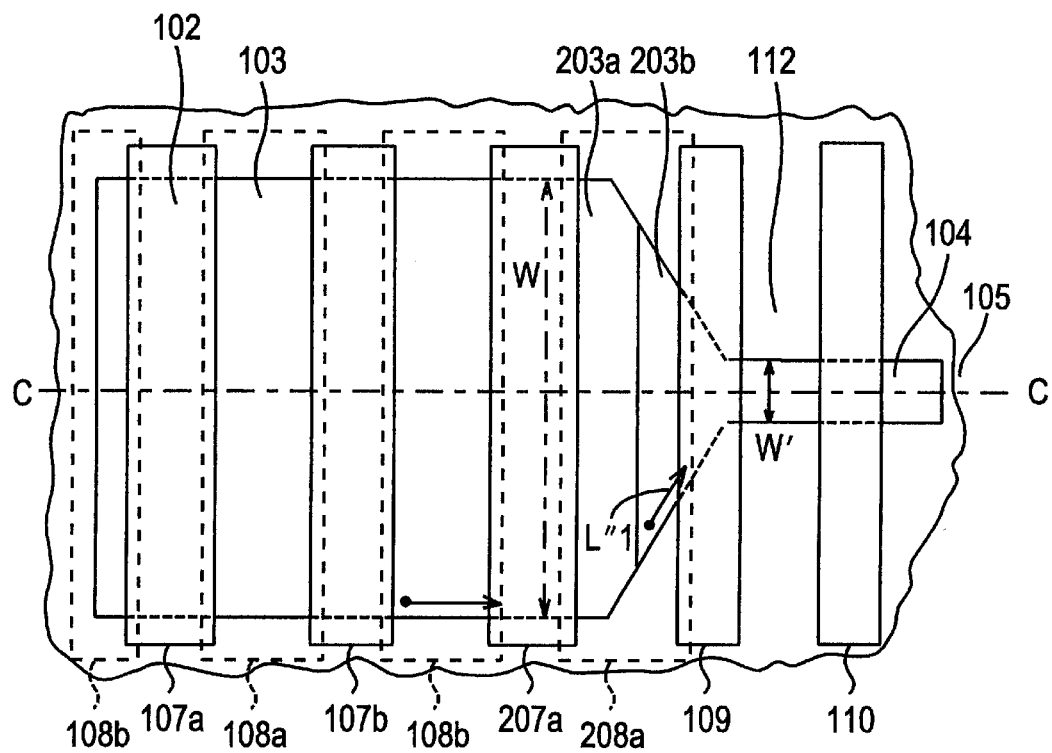
FIG. 8 is a plan view showing another charge transfer device according to the present invention.
Figure 9:
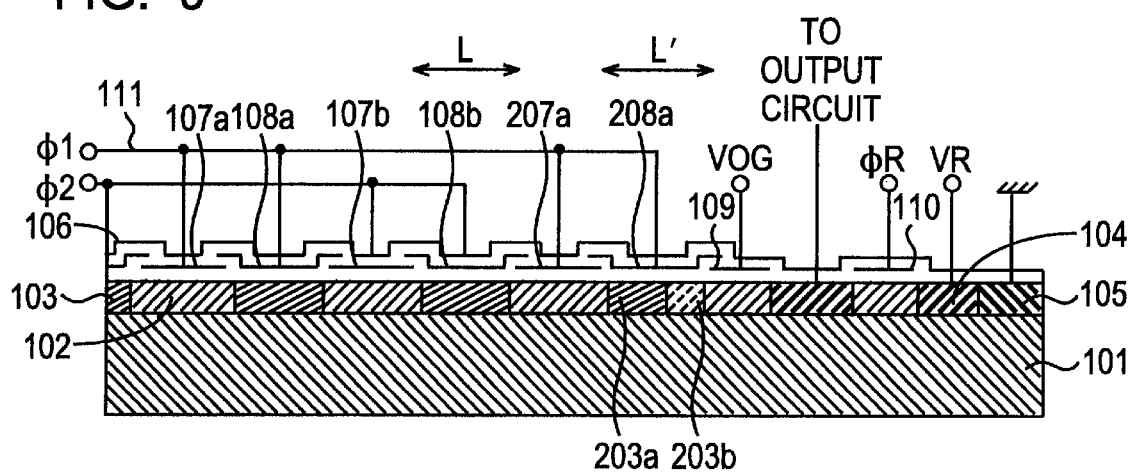
FIG. 9 is a cross sectional view taken along line C—C of FIG. 8 and showing the structure of the charge transfer device.

Turning to FIGS. 8 and 9, another charge transfer device embodying the present invention is fabricated on a p-type semiconductor substrate 101. The charge transfer device implementing the second embodiment is similar to the charge transfer device shown in FIGS. 5 and 6 except the n-type impurity sub-regions 203a and 203b. For this reason, other regions, electrodes and layers are labeled with the same references designating corresponding regions, electrodes and layers of the first embodiment without detailed description, and description is focused on the n-type impurity sub-regions 203a and 203b.

In the second embodiment, the potential well is formed in both n-type impurity sub-regions 203a/203b under the charge transfer electrode 208a. The n-type impurity sub-regions 203a/203b are regulated to appropriate values of the dopant concentration for the potential well to accumulate the charge packets.

Figure 10A:
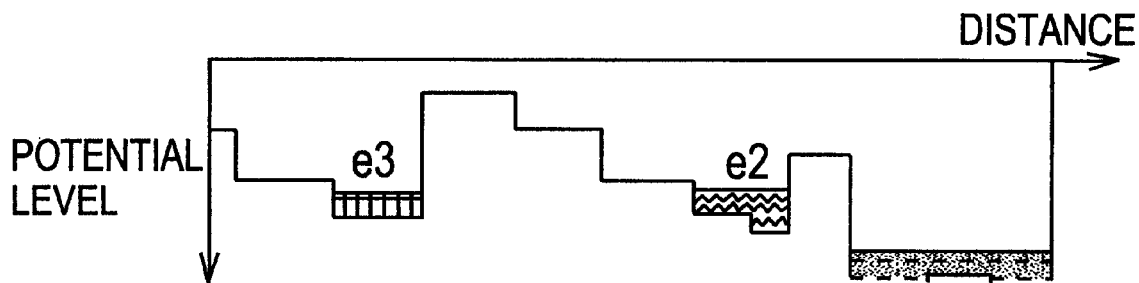
FIGS. 10A to 10C are graphs showing potential wells varied during the transfer of charge packets.
Figure 10B:
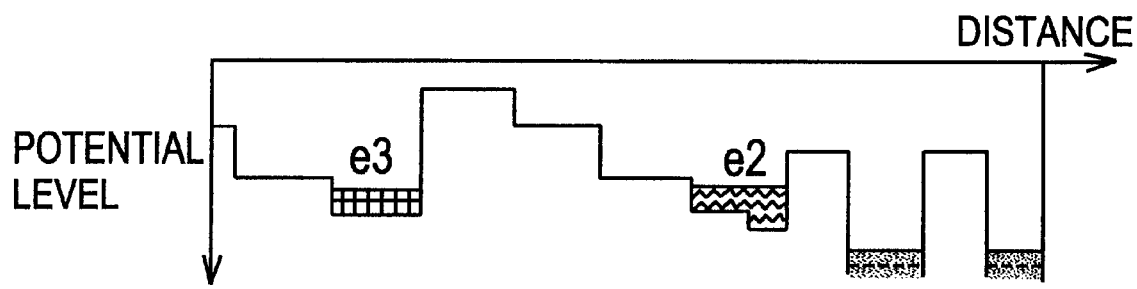
Figure 10C:
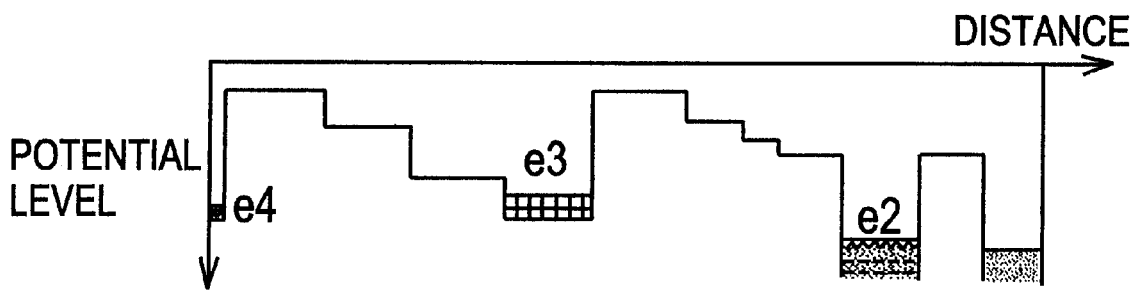

FIGS. 10A, 10B and 10C illustrate a charge transfer operation of the charge transfer device implementing the second embodiment. First, the reset pulse signal ΦR is applied to the gate electrode 110, and removes the potential barrier from the n-type impurity region 103 as shown in FIG. 10A. Signal charge flows from the floating diffusion region 112 to the heavily-doped n-type drain region 104, and the floating diffusion region 112 is reset to the reset voltage VR. The clock signal Φ1 is staying at a high level, and the other clock signal Φ2 is in the low level. The potential wells are created in the n-type impurity region 108a and the n-type impurity sub-regions 203a/203b, and charge packets e3 and e2 are accumulated in the potential wells, respectively. Although the potential well under the charge transfer electrode 208a are created in both n-type impurity sub-regions 203a/203b, the potential well is relatively deep in the n-type impurity sub-region 203b, and is relatively shallow in the other n-type impurity sub-region 203a. For this reason, most of the charge packet e2 is accumulated in the n-type impurity sub-region 203b. The potential barrier separates the potential wells from one another.

Subsequently, the reset pulse signal ΦR is removed from the gate electrode 110, and the potential barrier is created in the n-type impurity region 103 between the floating diffusion region 112 and the heavily-doped n-type drain region 104 as shown in FIG. 10B. As a result, the floating diffusion region 112 is electrically isolated from the heavily-doped n-type drain region 104. The clock signal Φ1 and the other clock signal Φ2 are still in the high level and the low level, respectively, and the charge packets e3 and e2 remain in the potential well in the n-type impurity region 103 under the charge transfer electrode 108a and in the n-type impurity sub-regions 203a/203b under the charge transfer electrode 208a.

Subsequently, the clock signal Φ1 is changed to the low level, and the other clock signal Φ2 is changed to the high level. The clock signal Φ1 causes the potential well in the n-type impurity sub-regions 203a/203b to exceed the potential barrier in the lightly-doped n-type impurity region 102 under the gate electrode 109, and the charge packet e2 flows into the floating diffusion region 112 as shown in FIG. 10C. The charge packet e2 varies the potential level in the floating diffusion region 112, and, accordingly, the output circuit varies the potential level of the output signal.

Most of the charge packet e2 is accumulated in the potential well created in the n-type impurity sub-region 203b. In other words, most of the charge packet e2 flows over length L"1 less than the length L". Thus, the charge transfer device implementing the second embodiment achieves a high charge transfer efficiency. The potential well under the charge transfer electrode 208a is large enough to accumulate a charge packet.

Third Embodiment

Figure 11:
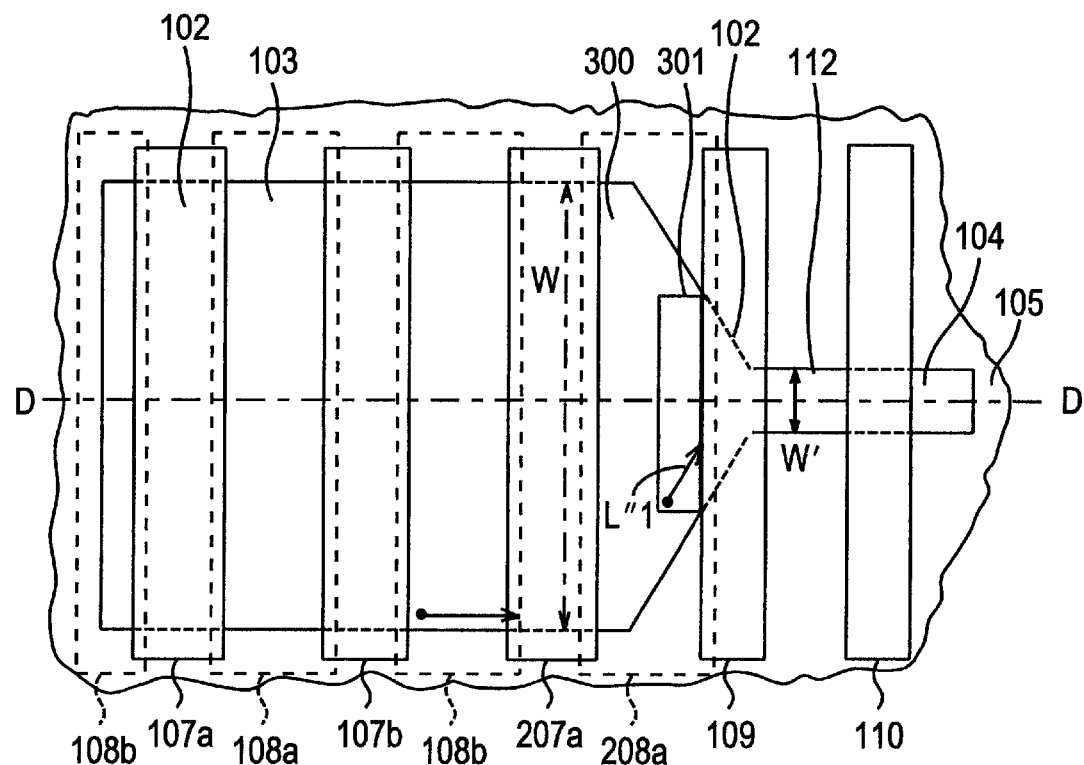
FIG. 11 is a plan view showing yet another charge transfer device according to the present invention.
Figure 12:
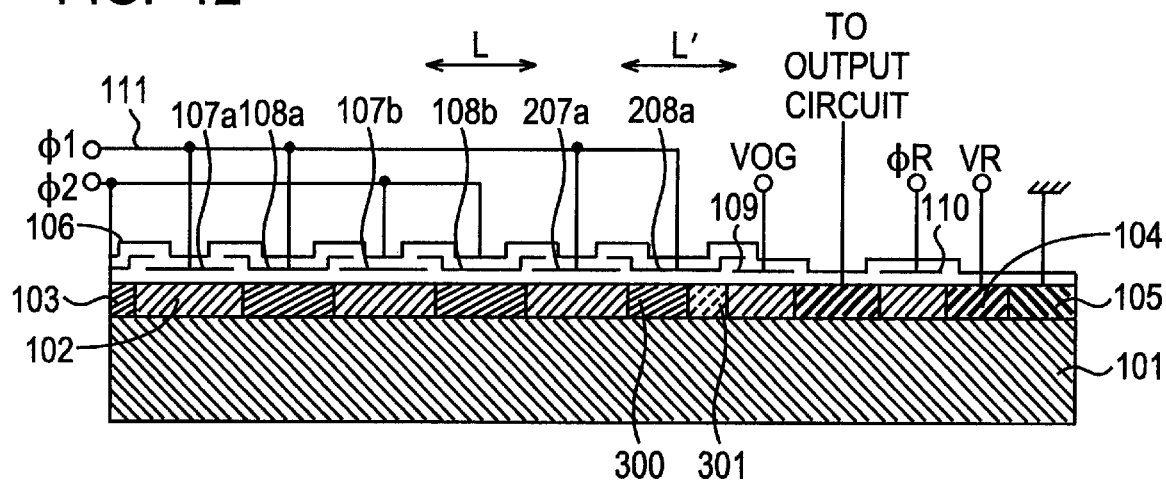
FIG. 12 is a cross sectional view taken along line D—D of FIG. 11 and showing the structure of the charge transfer device.

Turning to FIGS. 11 and 12, yet another charge transfer device embodying the present invention is fabricated on a p-type semiconductor substrate 101. The charge transfer device implementing the third embodiment is similar to the charge transfer device shown in FIGS. 5 and 6 except n-type impurity sub-regions 300 and 301. For this reason, other regions, electrodes and layers are labeled with the same references designating corresponding regions, electrodes and layers of the first embodiment without detailed description, and description is focused on the n-type impurity sub-regions 300 and 301.

In general, when a final potential well is closer to the floating diffusion region 112, the charge packet is required to travel to the floating diffusion region 112 over a shorter distance. For this reason, the potential well under the charge transfer electrode 208a is formed in a boundary region contiguous to the leftmost lightly-doped n-type impurity region 102. In detail, the n-type impurity sub-region 300 is smaller in dopant concentration than the other n-type impurity sub-region 301, and the n-type impurity sub-region 301 has a generally rectangular parallelepiped configuration. The n-type impurity sub-region 301 is narrower than the width W, but is wider than the width W'. One of the long edge lines of the n-type impurity sub-region 301 is aligned with the long edge line of the gate electrode 109, and the n-type impurity sub-region 301, and, accordingly, the n-type impurity sub-region 301 is contiguous to the leftmost lightly-doped n-type impurity region 102 under the gate electrode 109.

Figure 13A:
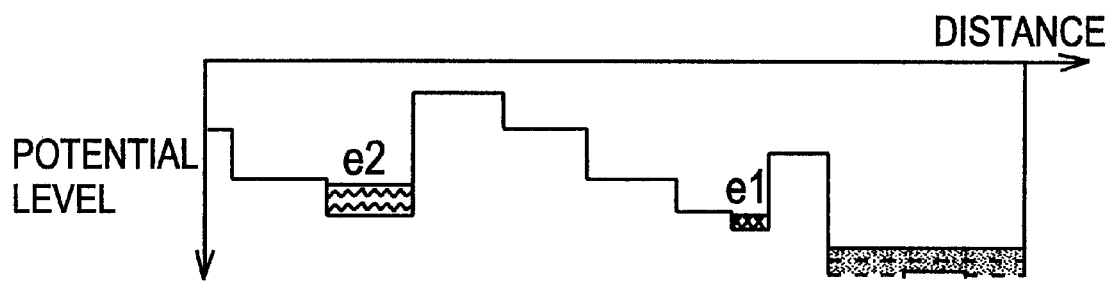
FIGS. 13A to 13C are graphs showing potential wells varied during the transfer of charge packets.
Figure 13B:
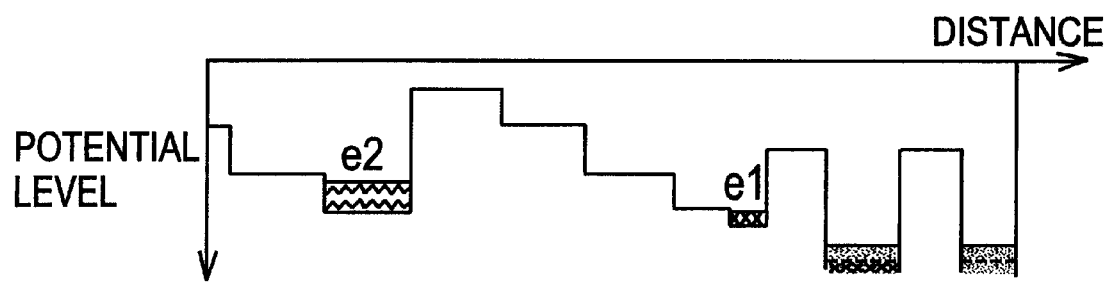
Figure 13C:
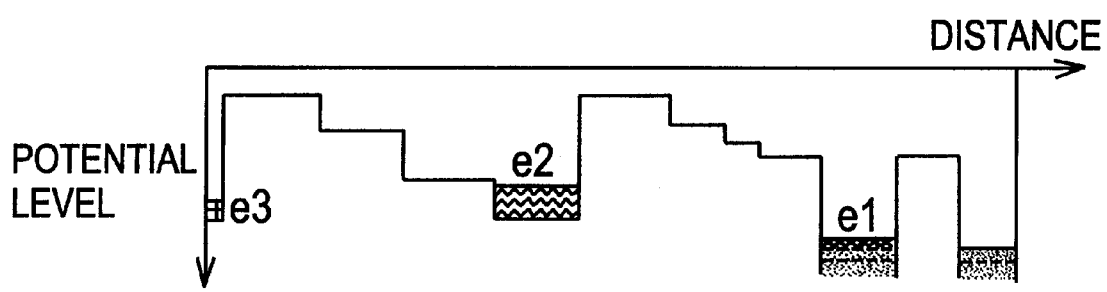

FIGS. 13A, 13B and 13C illustrate a charge transfer operation of the charge transfer device implementing the third embodiment. First, the reset pulse signal ΦR is applied to the gate electrode 110, and removes the potential barrier from the n-type impurity region 103 as shown in FIG. 13A. Signal charge flows from the floating diffusion region 112 to the heavily-doped n-type drain region 104, and the floating diffusion region 112 is reset to the reset voltage VR. The clock signal Φ1 is staying at a high level, and the other clock signal Φ2 is in the low level. The potential wells are created in the n-type impurity region 108a and the n-type impurity sub-region 301, and charge packets e2 and e1 are accumulated in the potential wells, respectively. The charge packet e1 is accumulated in the n-type impurity sub-region 301, only. The potential barrier separates the potential wells from one another.

Subsequently, the reset pulse signal ΦR is removed from the gate electrode 110, and the potential barrier is created in the n-type impurity region 103 between the floating diffusion region 112 and the heavily-doped n-type drain region 104 as shown in FIG. 13B. As a result, the floating diffusion region 112 is electrically isolated from the heavily-doped n-type drain region 104. The clock signal Φ1 and the other clock signal Φ2 are still in the high level and the low level, respectively, and the charge packets e2 and e1 remain in the potential well in the n-type impurity region 103 under the charge transfer electrode 108a and in the n-type impurity sub-region 301 under the charge transfer electrode 208a.

Subsequently, the clock signal Φ1 is changed to the low level, and the other clock signal Φ2 is changed to the high level. The clock signal Φ1 causes the potential well in the n-type impurity sub-region 301 to exceed the potential barrier in the lightly-doped n-type impurity region 102 under the gate electrode 109, and the charge packet e1 flows into the floating diffusion region 112 as shown in FIG. 13C. The charge packet e1 varies the potential level in the floating diffusion region 112, and, accordingly, the output circuit varies the potential level of the output signal.

The charge packet e1 is accumulated in the potential well created in the n-type impurity sub-region 301. In other words, the charge packet e1 flows over length L"1 less than the length L". Thus, the charge transfer device implementing the third embodiment achieves a high charge transfer efficiency.

Fourth Embodiment

Figure 14:
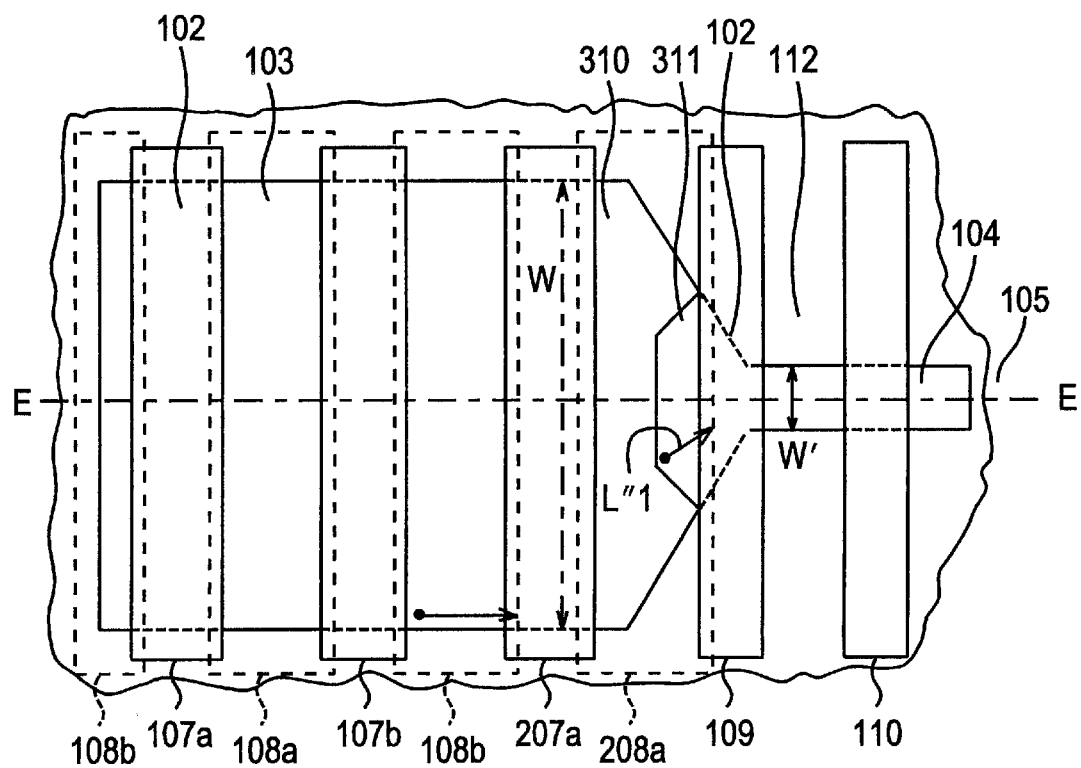
FIG. 14 is a plan view showing still another charge transfer device according to the present invention.
Figure 15:
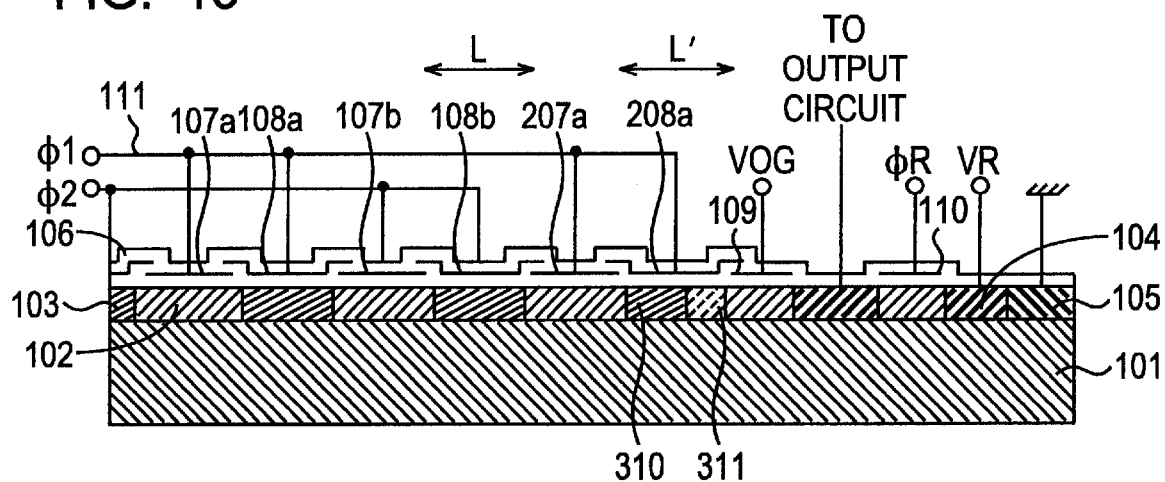
FIG. 15 is a cross sectional view taken along line E—E of FIG. 14 and showing the structure of the charge transfer device.

Turning to FIGS. 14 and 15, still another charge transfer device embodying the present invention is fabricated on a p-type semiconductor substrate 101. The charge transfer device implementing the fourth embodiment is similar to the charge transfer device shown in FIGS. 5 and 6 except n-type impurity sub-regions 310 and 311. For this reason, other regions, electrodes and layers are labeled with the same references designating corresponding regions, electrodes and layers of the first embodiment without detailed description, and description is focused on the n-type impurity sub-regions 310 and 311.

The potential well under the charge transfer electrode 208a is formed in a boundary region contiguous to the leftmost lightly-doped n-type impurity region 102 as similar to the third embodiment. In detail, the n-type impurity sub-region 310 is smaller in dopant concentration than the other n-type impurity sub-region 311, and the n-type impurity sub-region 311 has a trapezoidal upper surface. The trapezoidal upper surface spreads out toward the leftmost lightly-doped n-type impurity region 102. The n-type impurity sub-region 311 is narrower than the width W, but is wider than the width W'. The n-type impurity sub-region 311 is contiguous to the leftmost lightly-doped n-type impurity region 102 under the gate electrode 109.

Figure 16A:
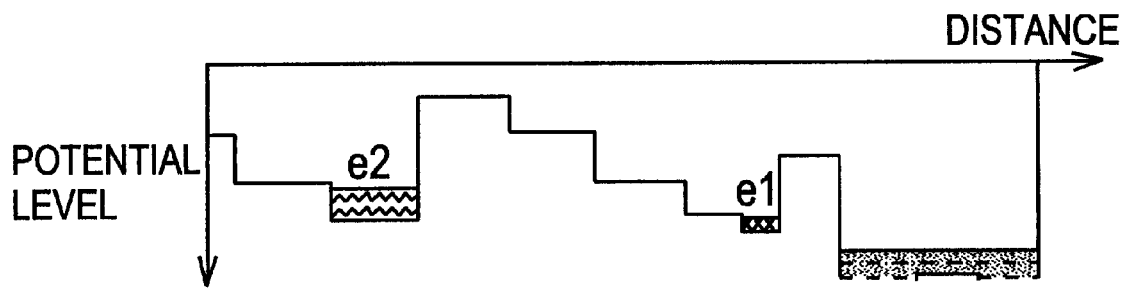
FIGS. 16A to 16C are graphs showing potential wells varied during the transfer of charge packets.
Figure 16B:
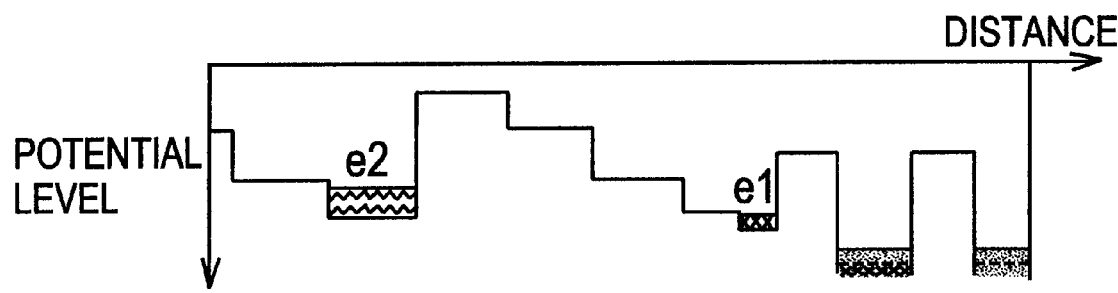
Figure 16C:
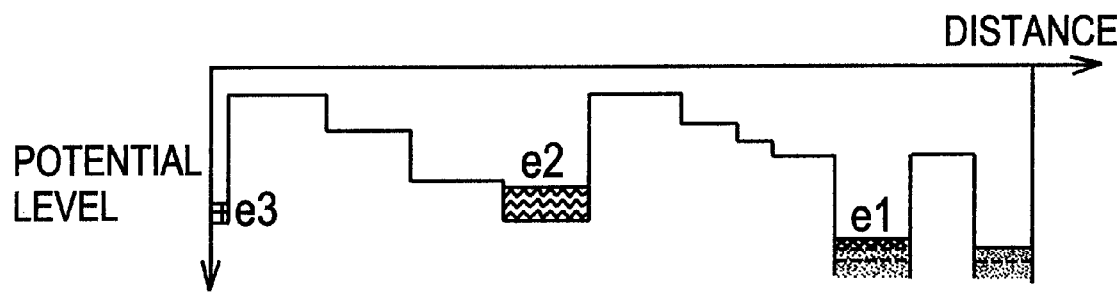

FIGS. 16A, 16B and 16C illustrate a charge transfer operation of the charge transfer device implementing the fourth embodiment. First, the reset pulse signal ΦR is applied to the gate electrode 110, and removes the potential barrier from the n-type impurity region 103 as shown in FIG. 16A. Signal charge flows from the floating diffusion region 112 to the heavily-doped n-type drain region 104, and the floating diffusion region 112 is reset to the reset voltage VR. The clock signal Φ1 is staying at a high level, and the other clock signal Φ2 is in the low level. The potential wells are created in the n-type impurity region 108a and the n-type impurity sub-region 311, and charge packets e2 and e1 are accumulated in the potential wells, respectively. The charge packet e1 is accumulated in the n-type impurity sub-region 311, only. The potential barrier separates the potential wells from one another.

Subsequently, the reset pulse signal ΦR is removed from the gate electrode 110, and the potential barrier is created in the n-type impurity region 103 between the floating diffusion region 112 and the heavily-doped n-type drain region 104 as shown in FIG. 16B. The floating diffusion region 112 is electrically isolated from the heavily-doped n-type drain region 104. The clock signal Φ1 and the other clock signal Φ2 are still in the high level and the low level, respectively, and the charge packets e2 and e1 remain in the potential well in the n-type impurity region 103 under the charge transfer electrode 108a and in the n-type impurity sub-region 311 under the charge transfer electrode 208a.

Subsequently, the clock signal Φ1 is changed to the low level, and the other clock signal Φ2 is changed to the high level. The clock signal Φ1 causes the potential well in the n-type impurity sub-region 311 to exceed the potential barrier in the lightly-doped n-type impurity region 102 under the gate electrode 109, and the charge packet e1 flows into the floating diffusion region 112 as shown in FIG. 16C. The charge packet e1 varies the potential level in the floating diffusion region 112, and, accordingly, the output circuit varies the potential level of the output signal.

The charge packet e1 is accumulated in the potential well created in the n-type impurity sub-region 311. In other words, the charge packet e1 flows over length L"1 less than the length L". Thus, the charge transfer device implementing the fourth embodiment achieves a high charge transfer efficiency.

Fifth Embodiment

Figure 17:
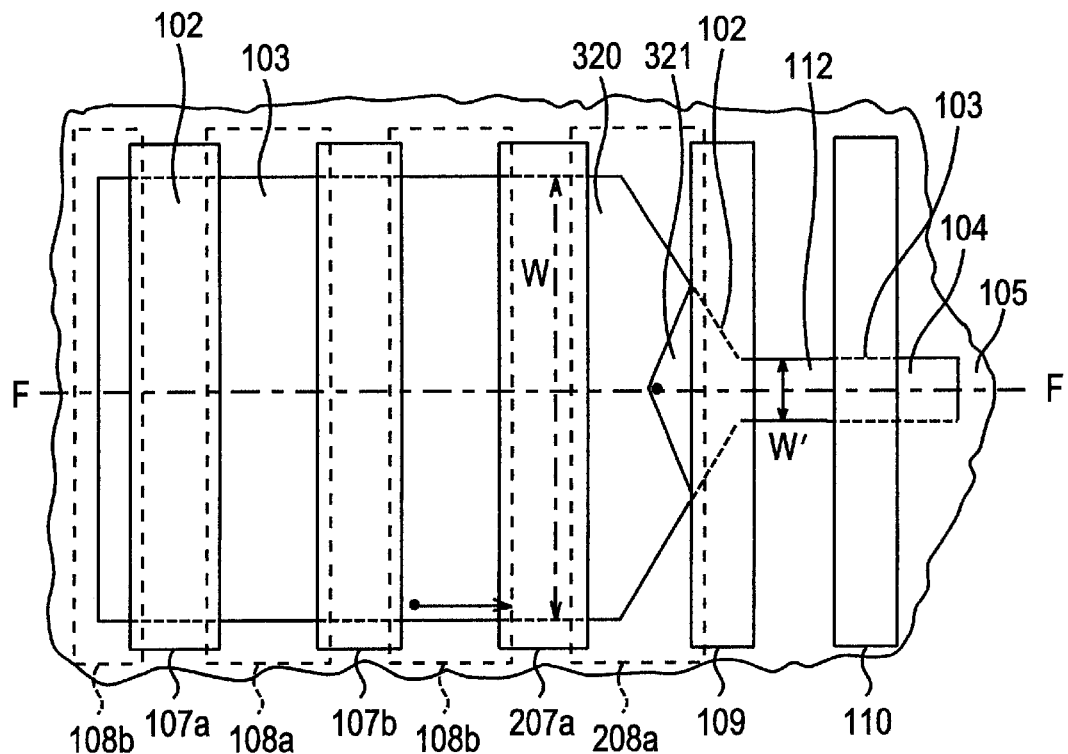
FIG. 17 is a plan view showing yet another charge transfer device according to the present invention.
Figure 18:
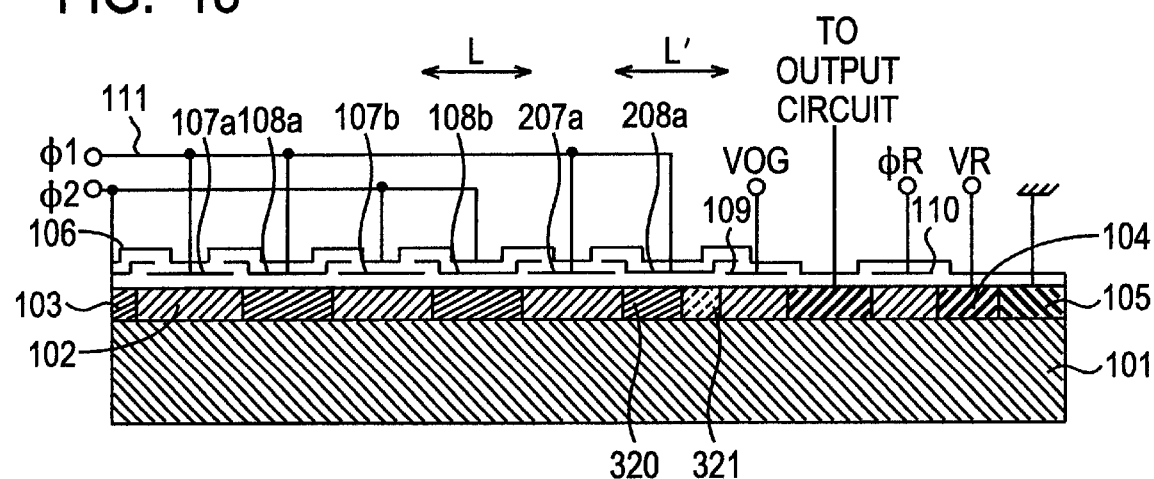
FIG. 18 is a cross sectional view taken along line F—F of FIG. 17 and showing the structure of the charge transfer device.

Turning to FIGS. 17 and 18, yet another charge transfer device embodying the present invention is fabricated on a p-type semiconductor substrate 101. The charge transfer device implementing the fifth embodiment is similar to the charge transfer device shown in FIGS. 5 and 6 except n-type impurity sub-regions 320 and 321. For this reason, other regions, electrodes and layers are labeled with the same references designating corresponding regions, electrodes and layers of the first embodiment without detailed description, and description is focused on the n-type impurity sub-regions 320 and 321.

The potential well under the charge transfer electrode 208a is formed in a boundary region contiguous to the leftmost lightly-doped n-type impurity region 102 as similar to the third and fourth embodiments. In detail, the n-type impurity sub-region 320 is smaller in dopant concentration than the other n-type impurity sub-region 321, and the n-type impurity sub-region 321 has a triangle upper surface. The triangle upper surface spreads out toward the leftmost lightly-doped n-type impurity region 102. The n-type impurity sub-region 321 is narrower than the width W, but is wider than the width W'. The n-type impurity sub-region 321 is contiguous to the leftmost lightly-doped n-type impurity region 102 under the gate electrode 109.

Figure 19A:
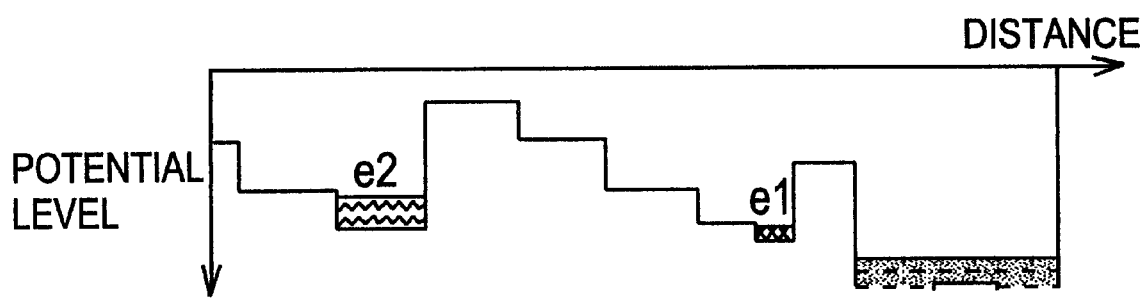
FIGS. 19A to 19C are graphs showing potential wells varied during the transfer of charge packets.
Figure 19B:
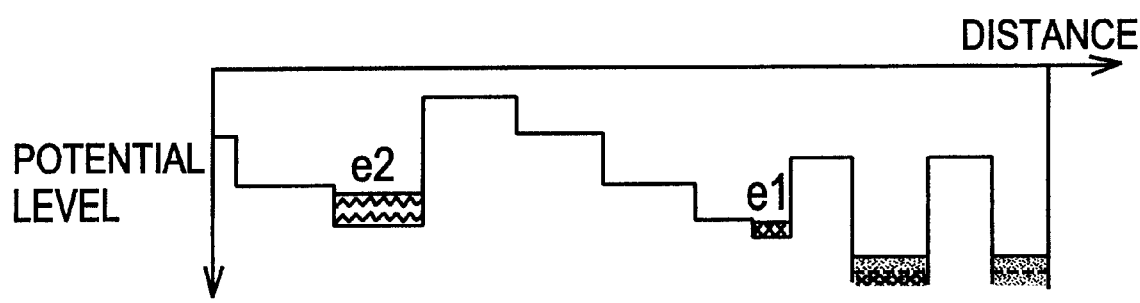
Figure 19C:
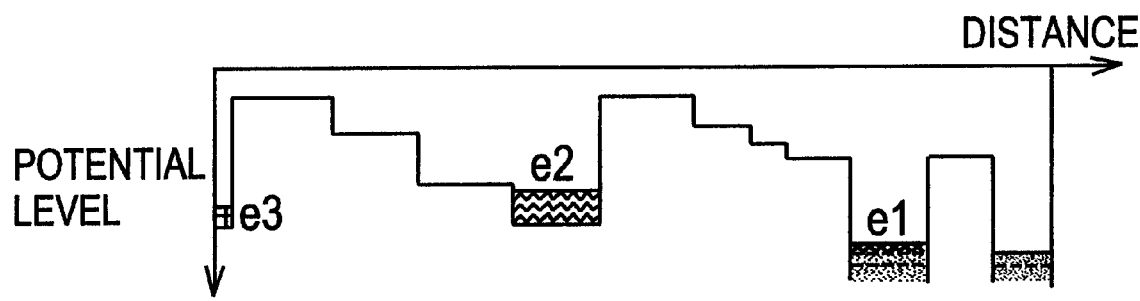

FIGS. 19A, 19B and 19C illustrate a charge transfer operation of the charge transfer device implementing the fifth embodiment. First, the reset pulse signal ΦR is applied to the gate electrode 110, and removes the potential barrier from the n-type impurity region 103 as shown in FIG. 19A. Signal charge flows from the floating diffusion region 112 to the heavily-doped n-type drain region 104, and the floating diffusion region 112 is reset to the reset voltage VR. The clock signal Φ1 is staying at a high level, and the other clock signal Φ2 is in the low level. The potential wells are created in the n-type impurity region 108a and the n-type impurity sub-region 321, and charge packets e2 and e1 are accumulated in the potential wells, respectively. The charge packet e1 is accumulated in the n-type impurity sub-region 321, only. The potential barrier separates the potential wells from one another.

Subsequently, the reset pulse signal ΦR is removed from the gate electrode 110, and the potential barrier is created in the n-type impurity region 103 between the floating diffusion region 112 and the heavily-doped n-type drain region 104 as shown in FIG. 19B. The floating diffusion region 112 is electrically isolated from the heavily-doped n-type drain region 104. The clock signal Φ1 and the other clock signal Φ2 are still in the high level and the low level, respectively, and the charge packets e2 and e1 remain in the potential well in the n-type impurity region 103 under the charge transfer electrode 108a and in the n-type impurity sub-region 321 under the charge transfer electrode 208a.

Subsequently, the clock signal Φ1 is changed to the low level, and the other clock signal Φ2 is changed to the high level. The clock signal Φ1 causes the potential well in the n-type impurity sub-region 321 to exceed the potential barrier in the lightly-doped n-type impurity region 102 under the gate electrode 109, and the charge packet e1 flows into the floating diffusion region 112 as shown in FIG. 19C. The charge packet e1 varies the potential level in the floating diffusion region 112, and, accordingly, the output circuit varies the potential level of the output signal.

The charge packet e1 is accumulated in the potential well created in the n-type impurity sub-region 321. In other words, the charge packet e1 flows over length less than the length L'. Thus, the charge transfer device implementing the fifth embodiment achieves a high charge transfer efficiency.

Sixth Embodiment

Figure 20:
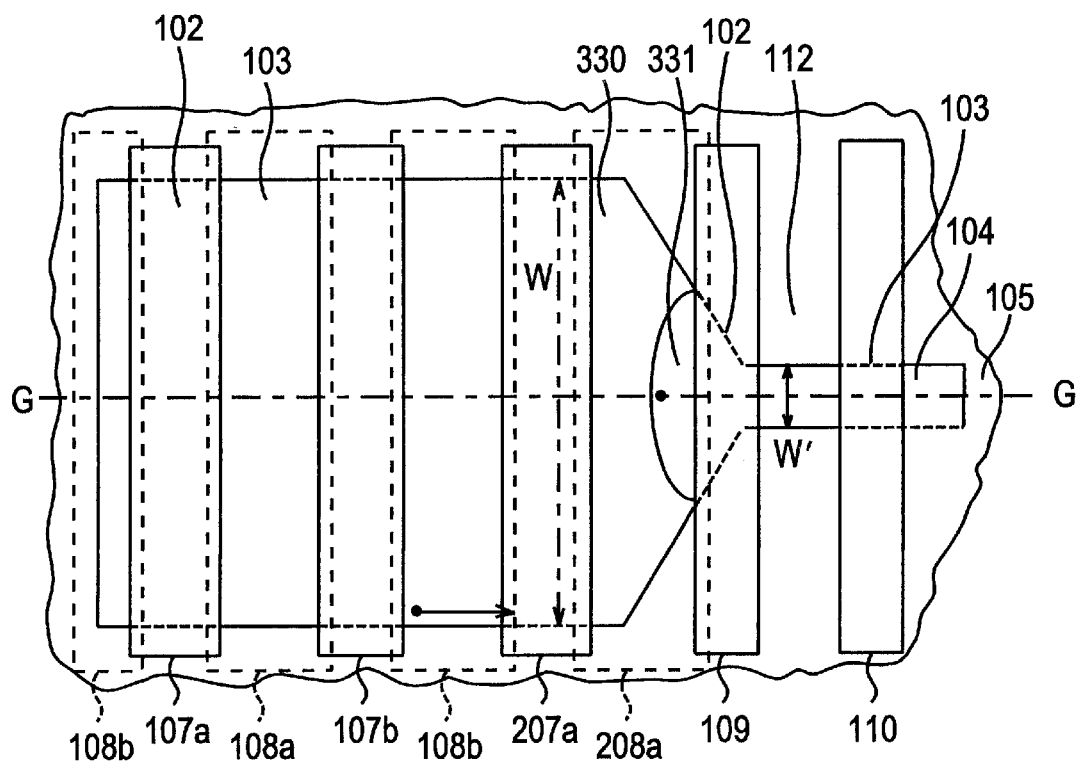
FIG. 20 is a plan view showing still another charge transfer device according to the present invention.
Figure 21:
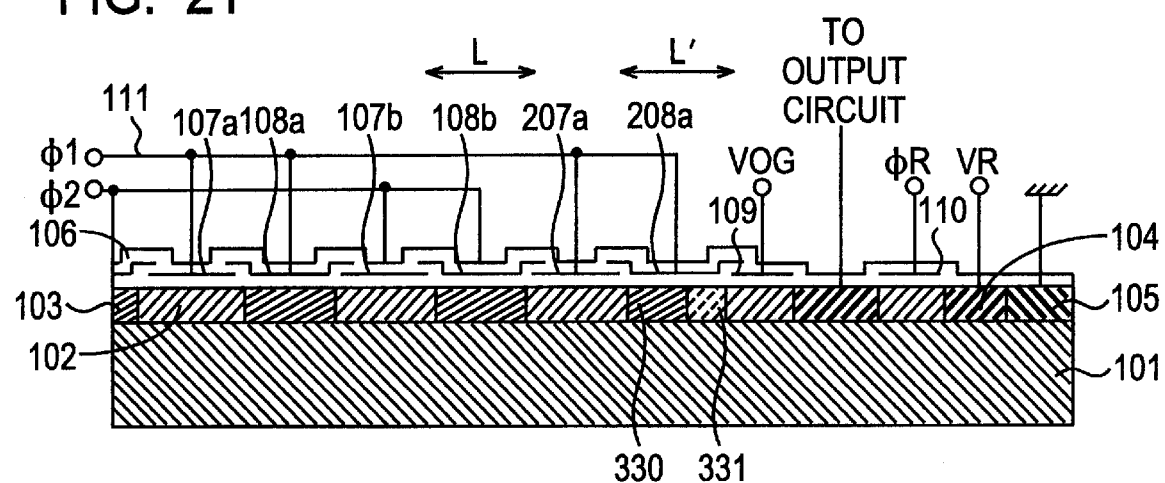
FIG. 21 is a cross sectional view taken along line G—G of FIG. 20 and showing the structure of the charge transfer device.

Turning to FIGS. 20 and 21, still another charge transfer device embodying the present invention is fabricated on a p-type semiconductor substrate 101. The charge transfer device implementing the sixth embodiment is similar to the charge transfer device shown in FIGS. 5 and 6 except n-type impurity sub-regions 330 and 331. For this reason, other regions, electrodes and layers are labeled with the same references designating corresponding regions, electrodes and layers of the first embodiment without detailed description, and description is focused on the n-type impurity sub-regions 330 and 331.

The potential well under the charge transfer electrode 208a is formed in a boundary region contiguous to the leftmost lightly-doped n-type impurity region 102 as similar to the third, fourth and fifth embodiments. In detail, the n-type impurity sub-region 330 is smaller in dopant concentration than the other n-type impurity sub-region 331, and the n-type impurity sub-region 331 has a semi-elliptic upper surface. The semi-elliptic upper surface spreads out toward the leftmost lightly-doped n-type impurity region 102. The n-type impurity sub-region 331 is narrower than the width W, but is wider than the width W'. The n-type impurity sub-region 331 is contiguous to the leftmost lightly-doped n-type impurity region 102 under the gate electrode 109.

Figure 22A:
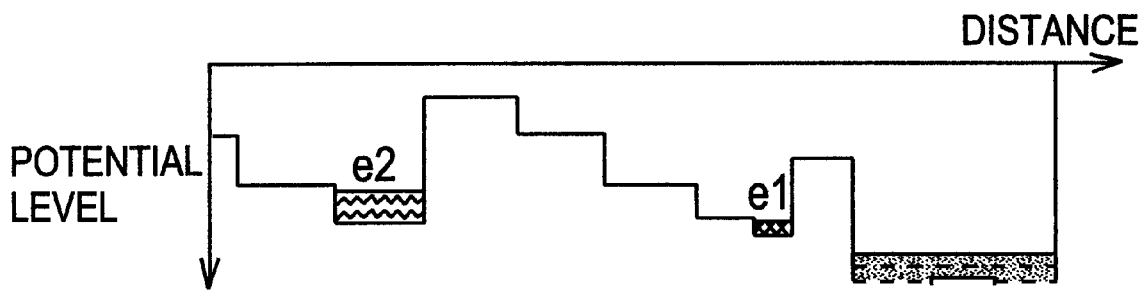
FIGS. 22A to 22C are graphs showing potential wells varied during the transfer of charge packets.
Figure 22B:
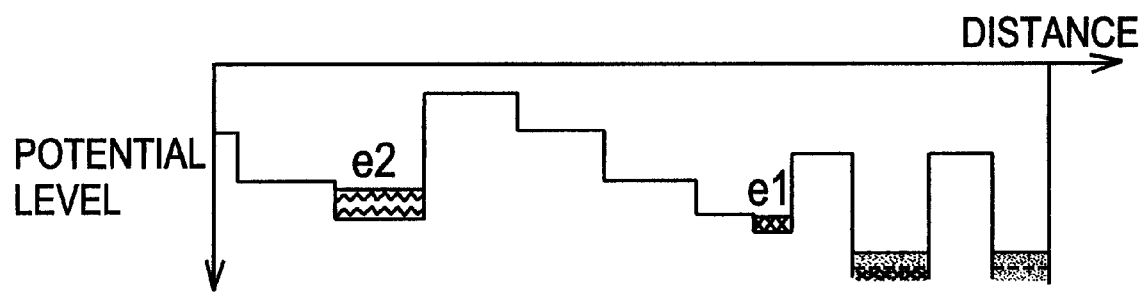
Figure 22C:
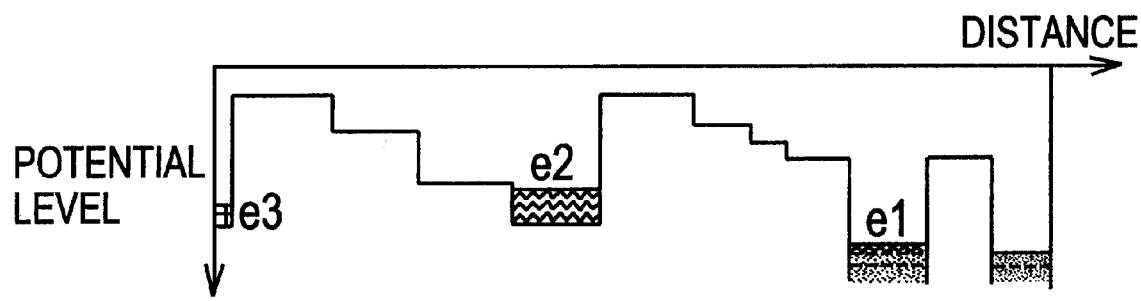

FIGS. 22A, 22B and 22C illustrate a charge transfer operation of the charge transfer device implementing the sixth embodiment. First, the reset pulse signal ΦR is applied to the gate electrode 110, and removes the potential barrier from the n-type impurity region 103 as shown in FIG. 22A. Signal charge flows from the floating diffusion region 112 to the heavily-doped n-type drain region 104, and the floating diffusion region 112 is reset to the reset voltage VR. The clock signal Φ1 is staying at a high level, and the other clock signal Φ2 is in the low level. The potential wells are created in the n-type impurity region 108a and the n-type impurity sub-region 331, and charge packets e2 and e1 are accumulated in the potential wells, respectively. The charge packet e1 is accumulated in the n-type impurity sub-region 331, only. The potential barrier separates the potential wells from one another.

Subsequently, the reset pulse signal ΦR is removed from the gate electrode 110, and the potential barrier is created in the n-type impurity region 103 between the floating diffusion region 112 and the heavily-doped n-type drain region 104 as shown in FIG. 22B. The floating diffusion region 112 is electrically isolated from the heavily-doped n-type drain region 104. The clock signal Φ1 and the other clock signal Φ2 are still in the high level and the low level, respectively, and the charge packets e2 and e1 remain in the potential well in the n-type impurity region 103 under the charge transfer electrode 108a and in the n-type impurity sub-region 331 under the charge transfer electrode 208a.

Subsequently, the clock signal Φ1 is changed to the low level, and the other clock signal Φ2 is changed to the high level. The clock signal Φ1 causes the potential well in the n-type impurity sub-region 331 to exceed the potential barrier in the lightly-doped n-type impurity region 102 under the gate electrode 109, and the charge packet e1 flows into the floating diffusion region 112 as shown in FIG. 22C. The charge packet e1 varies the potential level in the floating diffusion region 112, and, accordingly, the output circuit varies the potential level of the output signal.

The charge packet e1 is accumulated in the potential well created in the n-type impurity sub-region 331. In other words, the charge packet e1 flows over length less than the length L'. Thus, the charge transfer device implementing the sixth embodiment achieves a high charge transfer efficiency.

The n-type impurity sub-regions 301, 311, 321 and 331 can accumulate the charge packets different in quantity from one another. The designer selects the configuration of the n-type impurity sub-region 301/311/321/331 from the viewpoint of the maximum charge and the charge transfer efficiency.

Seventh Embodiment

Figure 23:
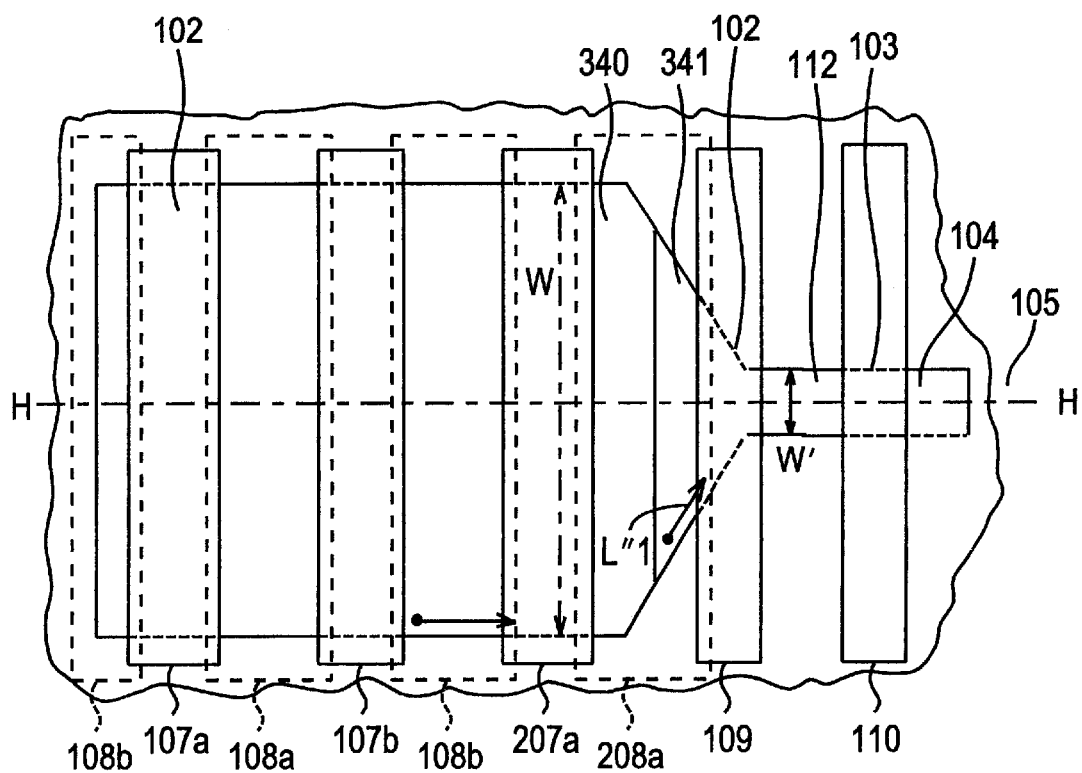
FIG. 23 is a plan view showing yet another charge transfer device according to the present invention.
Figure 24:
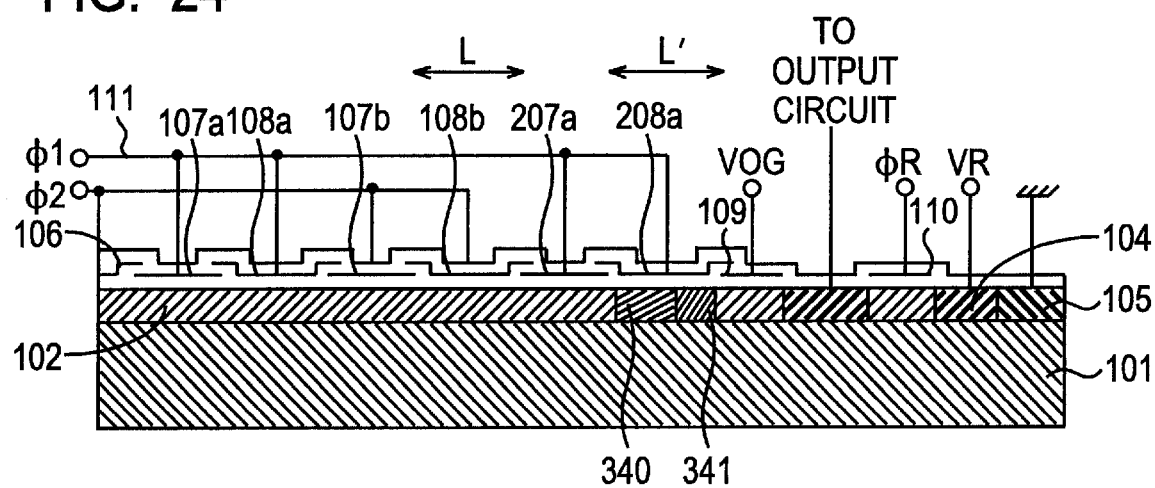
FIG. 24 is a cross sectional view taken along line H—H of FIG. 23 and showing the structure of the charge transfer device.

Turning to FIGS. 23 and 24, yet another charge transfer device embodying the present invention is fabricated on a p-type semiconductor substrate 101. The charge transfer device implementing the seventh embodiment is similar to the charge transfer device shown in FIGS. 5 and 6 except an n-type charge transfer region and the depth of the charge transfer electrodes. For this reason, other regions, electrodes and layers are labeled with the same references designating corresponding regions, electrodes and layers of the first embodiment without detailed description, and description is focused on the n-type charge transfer region.

The depth of a potential well is dependent on the thickness of an insulating layer between a charge transfer electrode and an impurity region as well as the dopant concentration of the impurity region. The n-type charge transfer region has n-type impurity sub-regions 340/341 under the charge transfer electrode 208a and the lightly-doped n-type impurity region 102 upstream of the n-type impurity sub-region 340. The n-type impurity sub-region 340 is larger in dopant concentration than the lightly-doped n-type impurity region 102, and the other n-type impurity sub-region 341 is larger in dopant concentration than the n-type impurity sub-region 340 and, accordingly, the lightly-doped n-type impurity region 102.

The charge transfer electrodes 107a/107b/207a/108a/108b/208a are buried in the insulating layer 106 as similar to the other embodiments. However, the charge transfer electrodes 108a/108b/208a are shallower than the other charge transfer electrodes 107a/107b/207a. In other words, the insulating layer 106 under the charge transfer electrodes 108a/108b/208a is thicker than the insulting layer under the other charge transfer electrodes 107a/107b/207a. For this reason, even though the clock signal Φ1 is, by way of example, applied to the charge transfer electrodes 107a/108a, the potential level is deeper in the lightly-doped n-type impurity region 102 under the charge transfer electrode 108a than in the lightly-doped n-type impurity region 102 under the charge transfer electrode 107a.

Figure 25A:
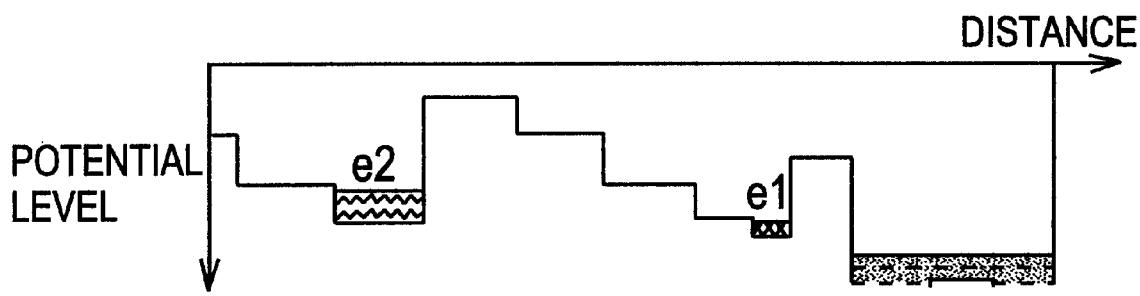
FIGS. 25A to 25C are graphs showing potential wells varied during the transfer of charge packets.
Figure 25B:
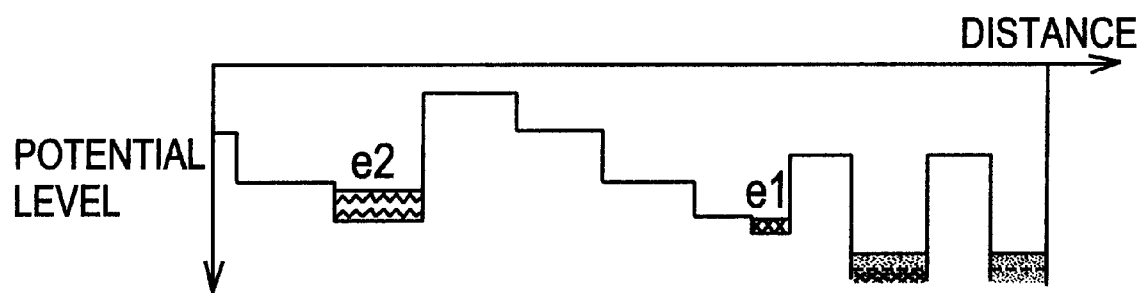
Figure 25C:
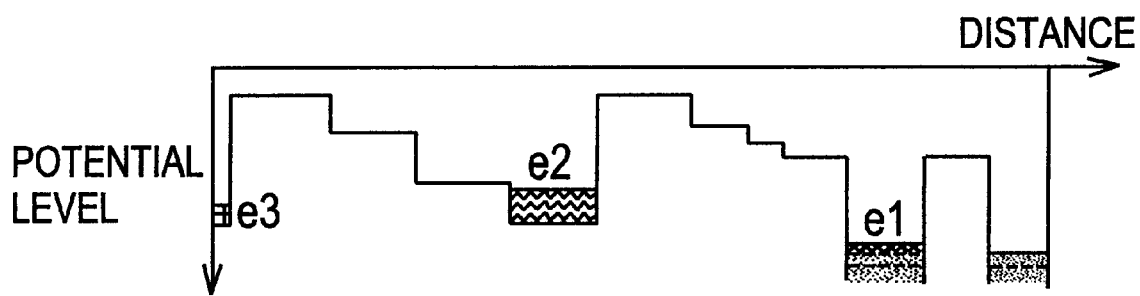

The charge transfer device implementing the seventh embodiment behaves as follows. FIGS. 25A, 25B and 25C illustrate a charge transfer operation of the charge transfer device implementing the seventh embodiment. First, the reset pulse signal ΦR is applied to the gate electrode 110, and removes the potential barrier from the n-type impurity region 103 as shown in FIG. 25A. Signal charge flows from the floating diffusion region 112 to the heavily-doped n-type drain region 104, and the floating diffusion region 112 is reset to the reset voltage VR. The clock signal Φ1 is staying at a high level, and the other clock signal Φ2 is in the low level. The potential wells are created in the lightly-doped n-type impurity region 102 under the charge transfer electrode 108a and in the n-type impurity sub-region 341 under the charge transfer electrode 208a, and charge packets e2 and e1 are accumulated in the potential wells, respectively. The charge packet e1 is accumulated in the n-type impurity sub-region 341, only. The potential barrier separates the potential wells from one another.

Subsequently, the reset pulse signal ΦR is removed from the gate electrode 110, and the potential barrier is created in the n-type impurity region 103 between the floating diffusion region 112 and the heavily-doped n-type drain region 104 as shown in FIG. 25B. The floating diffusion region 112 is electrically isolated from the heavily-doped n-type drain region 104. The clock signal Φ1 and the other clock signal Φ2 are still in the high level and the low level, respectively, and the charge packets e2 and e1 remain in the potential well in the lightly-doped n-type impurity region 102 under the charge transfer electrode 108a and in the n-type impurity sub-region 341 under the charge transfer electrode 208a.

Subsequently, the clock signal Φ1 is changed to the low level, and the other clock signal Φ2 is changed to the high level. The clock signal Φ1 causes the potential well in the n-type impurity sub-region 341 to exceed the potential barrier in the lightly-doped n-type impurity region 102 under the gate electrode 109, and the charge packet e1 flows into the floating diffusion region 112 as shown in FIG. 25C. The charge packet e1 varies the potential level in the floating diffusion region 112, and, accordingly, the output circuit varies the potential level of the output signal.

The charge packet e1 is accumulated in the potential well created in the n-type impurity sub-region 341. In other words, the charge packet e1 flows over length L"1 less than the length L'. Thus, the charge transfer device implementing the seventh embodiment achieves a high charge transfer efficiency.

Eighth Embodiment

Figure 26:
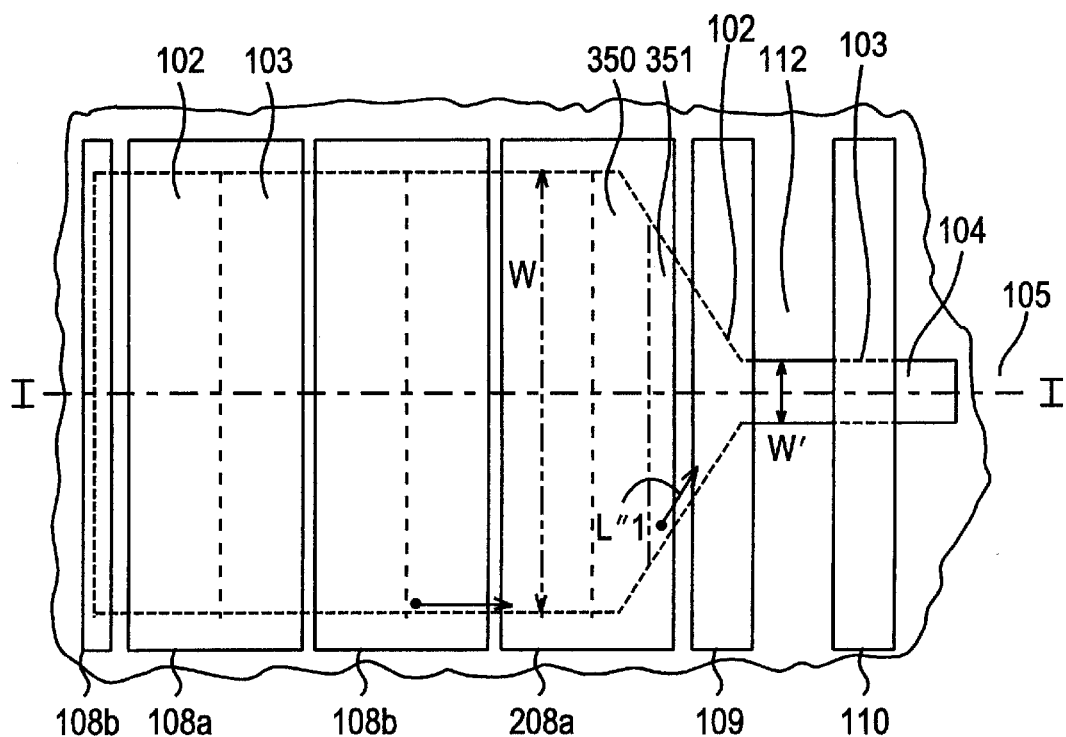
FIG. 26 is a plan view showing still another charge transfer device according to the present invention.
Figure 27:
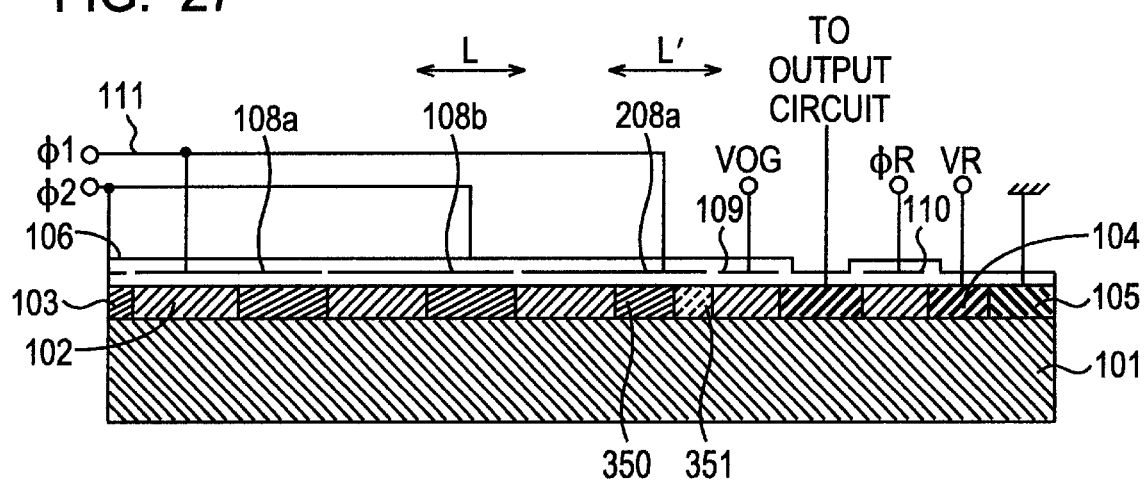
FIG. 27 is a cross sectional view taken along line I—I of FIG. 26 and showing the structure of the charge transfer device.

FIGS. 26 and 27 illustrate still another charge transfer device embodying the present invention. Although the above-described charge transfer devices are of the type having a two-layered charge transfer electrodes and driven by the two-phase driving signal Φ1/Φ2, the charge transfer device implementing the eighth embodiment has a single layered charge transfer electrode, and is driven by a two-phase driving signal Φ1/Φ2. For this reason, the charge transfer electrodes 108a/108b/208a are equally spaced from the n-type charge transfer region 102/103/350/351 without any overlapped portion.

Figure 28A:
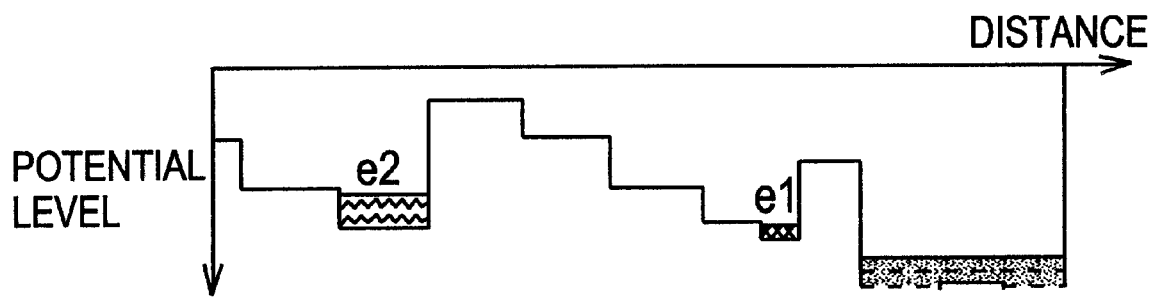
FIGS. 28A to 28C are graphs showing potential wells varied during the transfer of charge packets.
Figure 28B:
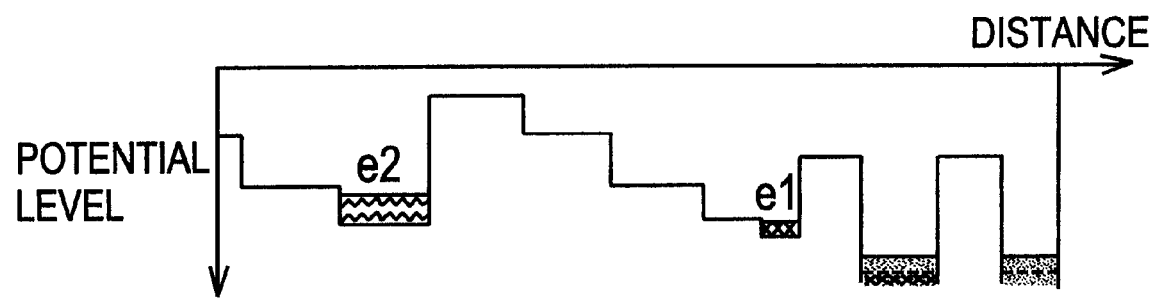
Figure 28C:
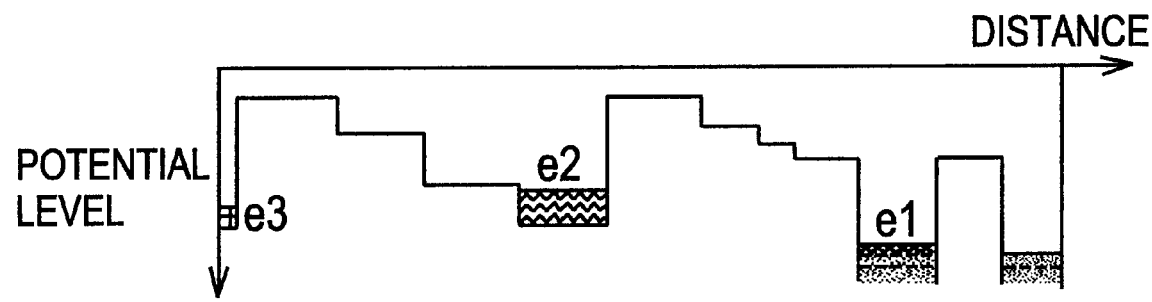

The charge transfer device implementing the eighth embodiment behaves as follows. FIGS. 28A, 28B and 28C illustrate a charge transfer operation of the charge transfer device implementing the eighth embodiment. First, the reset pulse signal ΦR is applied to the gate electrode 110, and removes the potential barrier from the n-type impurity region 103 as shown in FIG. 28A. Signal charge flows from the floating diffusion region 112 to the heavily-doped n-type drain region 104, and the floating diffusion region 112 is reset to the reset voltage VR. The clock signal Φ1 is staying at a high level, and the other clock signal Φ2 is in the low level. The potential wells are created in the heavily-doped n-type impurity region 103 under the charge transfer electrode 108a and in the n-type impurity sub-region 351 under the charge transfer electrode 208a, and charge packets e2 and e1 are accumulated in the potential wells, respectively. The charge packet e1 is accumulated in the n-type impurity sub-region 351, only. The potential barrier separates the potential wells from one another.

Subsequently, the reset pulse signal ΦR is removed from the gate electrode 110, and the potential barrier is created in the n-type impurity region 103 between the floating diffusion region 112 and the heavily-doped n-type drain region 104 as shown in FIG. 28B. The floating diffusion region 112 is electrically isolated from the heavily-doped n-type drain region 104. The clock signal Φ1 and the other clock signal Φ2 are still in the high level and the low level, respectively, and the charge packets e2 and e1 remain in the potential well in the heavily-doped n-type impurity region 103 under the charge transfer electrode 108a and in the n-type impurity sub-region 351 under the charge transfer electrode 208a.

Subsequently, the clock signal Φ1 is changed to the low level, and the other clock signal Φ2 is changed to the high level. The clock signal Φ1 causes the potential well in the n-type impurity sub-region 351 to exceed the potential barrier in the lightly-doped n-type impurity region 102 under the gate electrode 109, and the charge packet e1 flows into the floating diffusion region 112 as shown in FIG. 28C. The charge packet e1 varies the potential level in the floating diffusion region 112, and, accordingly, the output circuit varies the potential level of the output signal.

The charge packet e1 is accumulated in the potential well created in the n-type impurity sub-region 351. In other words, the charge packet e1 flows over length L"1 less than the length L'. Thus, the charge transfer device implementing the eighth embodiment achieves a high charge transfer efficiency.

Ninth Embodiment

Figure 29:
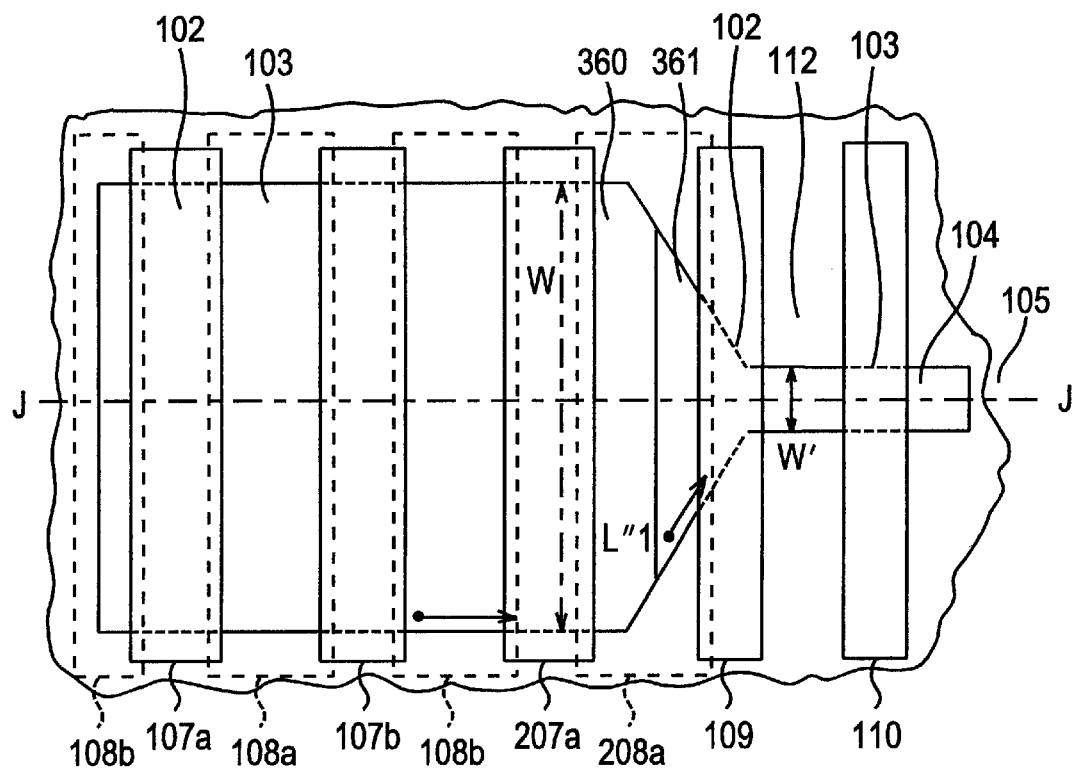
FIG. 29 is a plan view showing yet another charge transfer device according to the present invention.
Figure 30:
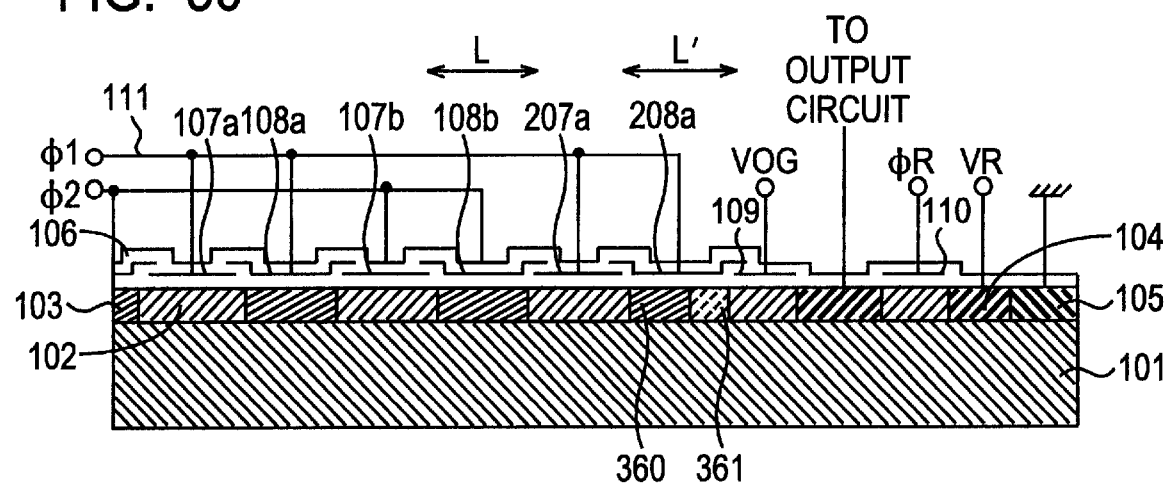
FIG. 30 is a cross sectional view taken along line J—J of FIG. 29 and showing the structure of the charge transfer device.

FIGS. 29 and 30 illustrate yet another charge transfer device embodying the present invention, and the charge transfer device is fabricated on a p-type semiconductor substrate 101. The charge transfer device implementing the ninth embodiment is similar to the charge transfer device shown in FIGS. 5 and 6 except n-type impurity sub-regions 360 and 361. For this reason, other regions, electrodes and layers are labeled with the same references designating corresponding regions, electrodes and layers of the first embodiment without detailed description, and description is focused on the n-type impurity sub-regions 360 and 361.

The dopant concentration in the n-type charge transfer region is not limited to those of the above-described embodiments in so far as the clock signals Φ1 and Φ2 appropriately create the potential wells and the potential barriers. In the ninth embodiment, the n-type impurity sub-region 360 is equal in dopant concentration to the n-type impurity region 103. The bottom edge of the conduction band in the other n-type impurity sub-region 361 is deeper than the bottom edge of the conduction band in the n-type impurity sub-region 360 and, accordingly, the bottom edge of the conduction band in the n-type impurity region 103.

Figure 31A:
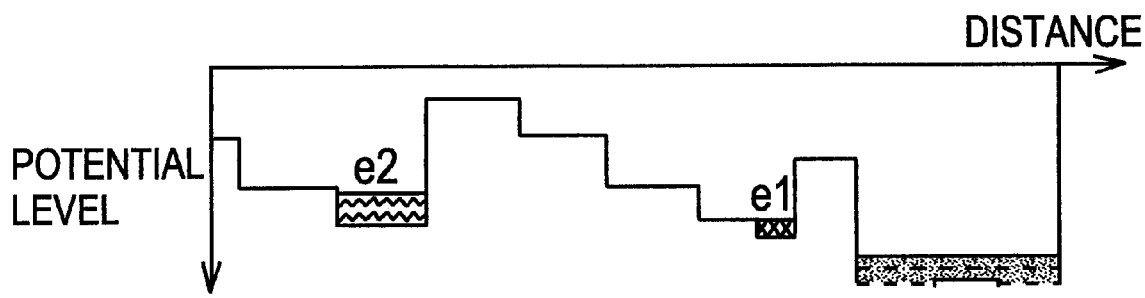
FIGS. 31A to 31C are graphs showing potential wells varied during the transfer of charge packets.
Figure 31B:
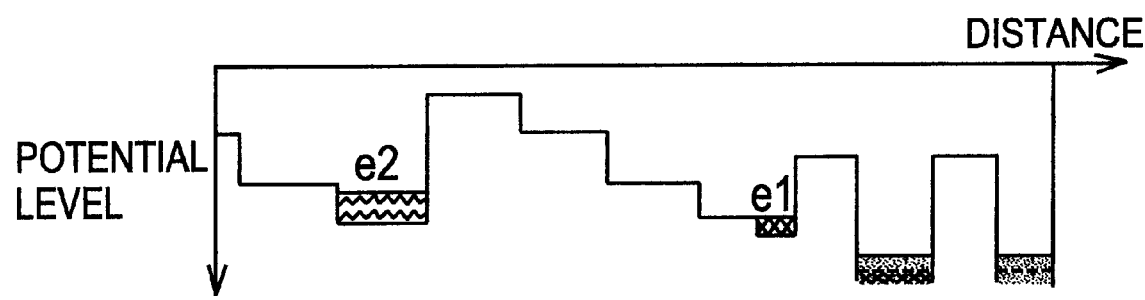
Figure 31C:
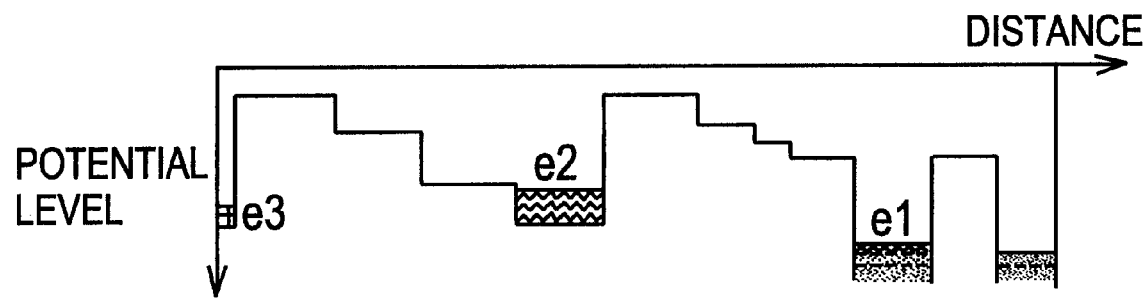

The charge transfer device implementing the ninth embodiment behaves as follows. FIGS. 31A, 31B and 31C illustrate a charge transfer operation of the charge transfer device implementing the ninth embodiment. First, the reset pulse signal ΦR is applied to the gate electrode 110, and removes the potential barrier from the n-type impurity region 103 as shown in FIG. 31A. Signal charge flows from the floating diffusion region 112 to the heavily-doped n-type drain region 104, and the floating diffusion region 112 is reset to the reset voltage VR. The clock signal Φ1 is staying at a high level, and the other clock signal Φ2 is in the low level. The potential wells are created in the heavily-doped n-type impurity region 103 under the charge transfer electrode 108a and in the n-type impurity sub-region 361 under the charge transfer electrode 208a, and charge packets e2 and e1 are accumulated in the potential wells, respectively. The charge packet e1 is accumulated in the n-type impurity sub-region 361, only. The potential barrier separates the potential wells from one another.

Subsequently, the reset pulse signal ΦR is removed from the gate electrode 110, and the potential barrier is created in the n-type impurity region 103 between the floating diffusion region 112 and the heavily-doped n-type drain region 104 as shown in FIG. 31B. The floating diffusion region 112 is electrically isolated from the heavily-doped n-type drain region 104. The clock signal Φ1 and the other clock signal Φ2 are still in the high level and the low level, respectively, and the charge packets e2 and e1 remain in the potential well in the heavily-doped n-type impurity region 103 under the charge transfer electrode 108a and in the n-type impurity sub-region 361 under the charge transfer electrode 208a.

Subsequently, the clock signal Φ1 is changed to the low level, and the other clock signal Φ2 is changed to the high level. The clock signal Φ1 causes the potential well in the n-type impurity sub-region 361 to exceed the potential barrier in the lightly-doped n-type impurity region 102 under the gate electrode 109, and the charge packet e1 flows into the floating diffusion region 112 as shown in FIG. 31C. The charge packet e1 varies the potential level in the floating diffusion region 112, and, accordingly, the output circuit varies the potential level of the output signal.

The charge packet e1 is accumulated in the potential well created in the n-type impurity sub-region 361. In other words, the charge packet e1 flows over length L"1 less than the length L'. Thus, the charge transfer device implementing the ninth embodiment achieves a high charge transfer efficiency. The n-type impurity sub-region 360 equal in dopant concentration to the n-type impurity region 103 is desirable, because the fabrication process is made simple.

Tenth Embodiment

Figure 32:
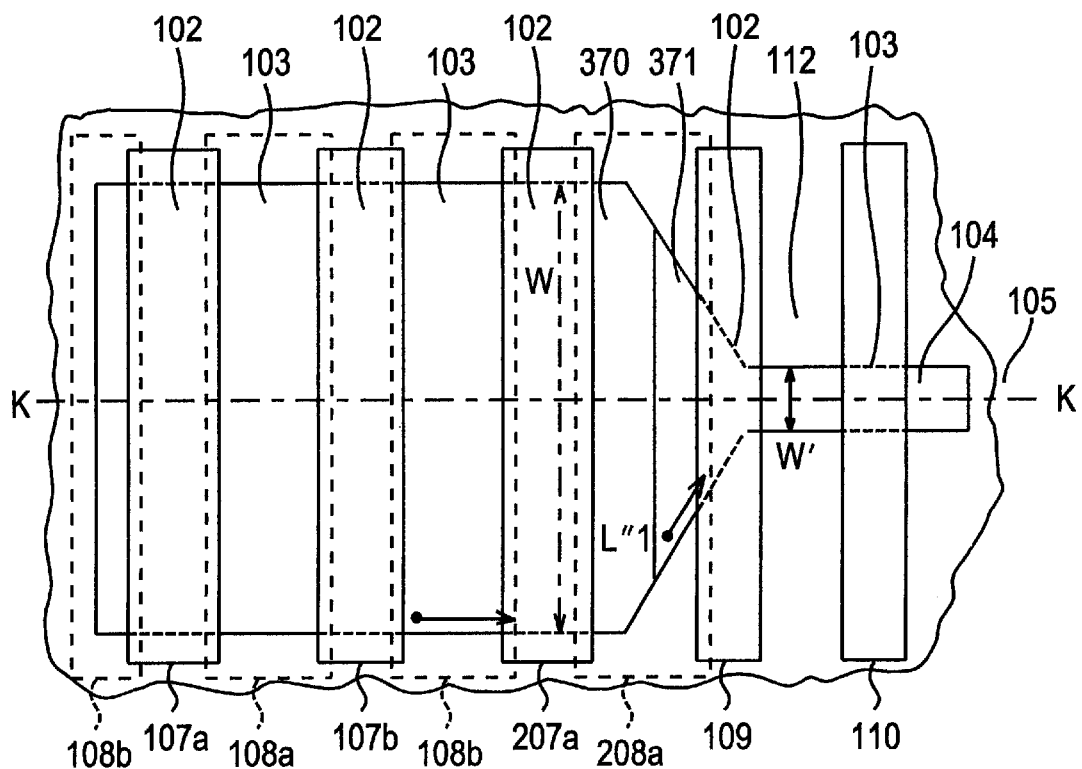
FIG. 32 is a plan view showing still another charge transfer device according to the present invention.
Figure 33:
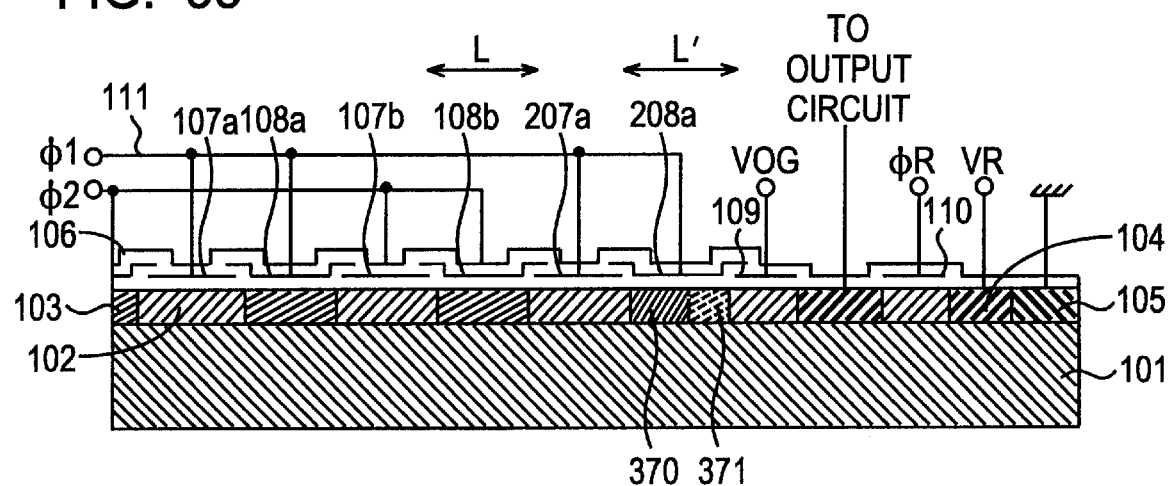
FIG. 33 is a cross sectional view taken along line K—K of FIG. 32 and showing the structure of the charge transfer device.

FIGS. 32 and 33 illustrate still another charge transfer device embodying the present invention, and the charge transfer device is fabricated on a p-type semiconductor substrate 101. The charge transfer device implementing the tenth embodiment is similar to the charge transfer device shown in FIGS. 5 and 6 except n-type impurity sub-regions 370 and 371. For this reason, other regions, electrodes and layers are labeled with the same references designating corresponding regions, electrodes and layers of the first embodiment without detailed description, and description is focused on the n-type impurity sub-regions 370 and 371.

From the above-described aspect for the potential wells and the potential barriers, the n-type impurity sub-region 371 is equal in dopant concentration to the n-type impurity region 103. The bottom edge of the conduction band in the other n-type impurity sub-region 370 is shallower than the bottom edge of the conduction band in the n-type impurity sub-region 371 and, accordingly, the bottom edge of the conduction band in the n-type impurity region 103.

Figure 34A:
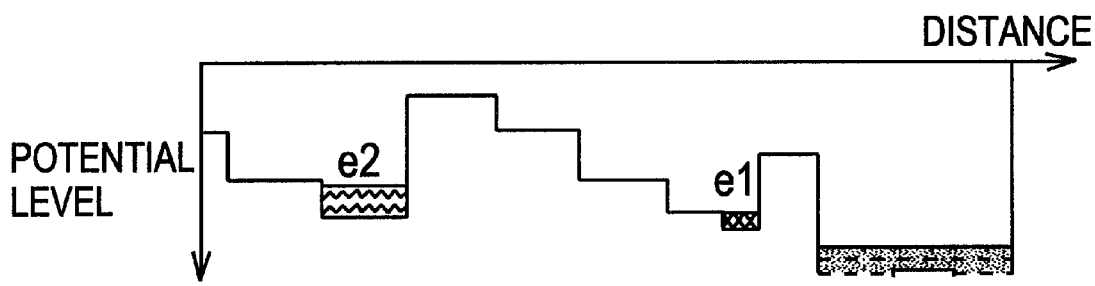
FIGS. 34A to 34C are graphs showing potential wells varied during the transfer of charge packets.
Figure 34B:
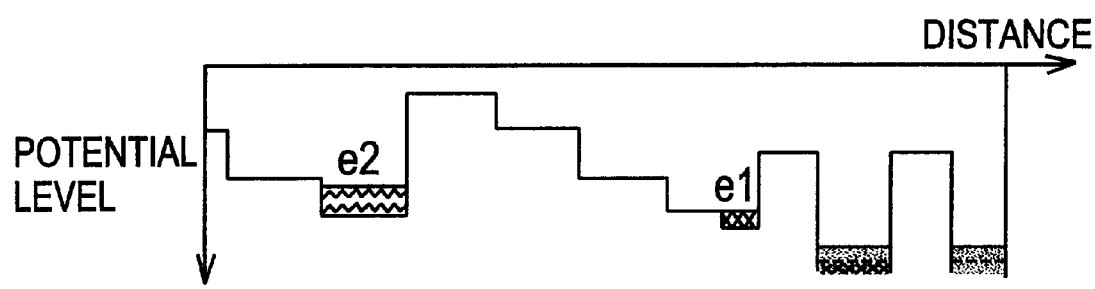
Figure 34C:
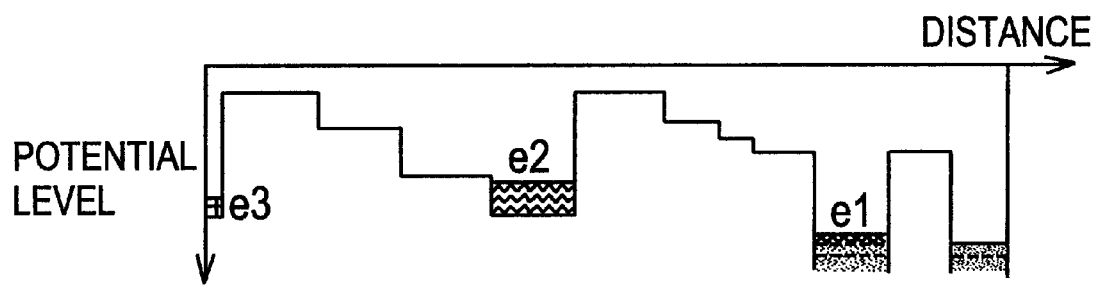

The charge transfer device implementing the tenth embodiment behaves as follows. FIGS. 34A, 34B and 34C illustrate a charge transfer operation of the charge transfer device implementing the tenth embodiment. First, the reset pulse signal ΦR is applied to the gate electrode 110, and removes the potential barrier from the n-type impurity region 103 as shown in FIG. 34A. Signal charge flows from the floating diffusion region 112 to the heavily-doped n-type drain region 104, and the floating diffusion region 112 is reset to the reset voltage VR. The clock signal Φ1 is staying at a high level, and the other clock signal Φ2 is in the low level. The potential wells are created in the heavily-doped n-type impurity region 103 under the charge transfer electrode 108a and in the n-type impurity sub-region 371 under the charge transfer electrode 208a, and charge packets e2 and e1 are accumulated in the potential wells, respectively. The charge packet e1 is accumulated in the n-type impurity sub-region 371, only. The potential barrier separates the potential wells from one another.

Subsequently, the reset pulse signal Φ R is removed from the gate electrode 110, and the potential barrier is created in the n-type impurity region 103 between the floating diffusion region 112 and the heavily-doped n-type drain region 104 as shown in FIG. 34B. The floating diffusion region 112 is electrically isolated from the heavily-doped n-type drain region 104. The clock signal Φ1 and the other clock signal Φ2 are still in the high level and the low level, respectively, and the charge packets e2 and e1 remain in the potential well in the heavily-doped n-type impurity region 103 under the charge transfer electrode 108a and in the n-type impurity sub-region 371 under the charge transfer electrode 208a.

Subsequently, the clock signal Φ1 is changed to the low level, and the other clock signal Φ2 is changed to the high level. The clock signal Φ1 causes the potential well in the n-type impurity sub-region 371 to exceed the potential barrier in the lightly-doped n-type impurity region 102 under the gate electrode 109, and the charge packet e1 flows into the floating diffusion region 112 as shown in FIG. 34C. The charge packet e1 varies the potential level in the floating diffusion region 112, and, accordingly, the output circuit varies the potential level of the output signal.

The charge packet e1 is accumulated in the potential well created in the n-type impurity sub-region 371. In other words, the charge packet e1 flows over length L"1 less than the length L'. Thus, the charge transfer device implementing the ninth embodiment achieves a high charge transfer efficiency.

The n-type impurity sub-region 371 equal in dopant concentration to the n-type impurity region 103 is desirable, because the fabrication process is made simple.

As will be appreciated from the foregoing description, the final potential well is created close to the floating diffusion region 112, and the accumulated signal charge is expected to travel over a short distance. For this reason, even if the charge transfer device conveys the charge packets at a high speed, residual signal charge is negligible, and the charge transfer device according to the present invention achieves a high charge transfer efficiency.

Although particular embodiments of the present invention have been shown and described, it will be apparent to those skilled in the art that various changes and modifications may be made without departing from the spirit and scope of the present invention.

For example, both of the dopant concentration in the n-type charge transfer region and the depth of the charge transfer electrode may be varied for appropriately create potential wells and potential barriers.

Figure 35:
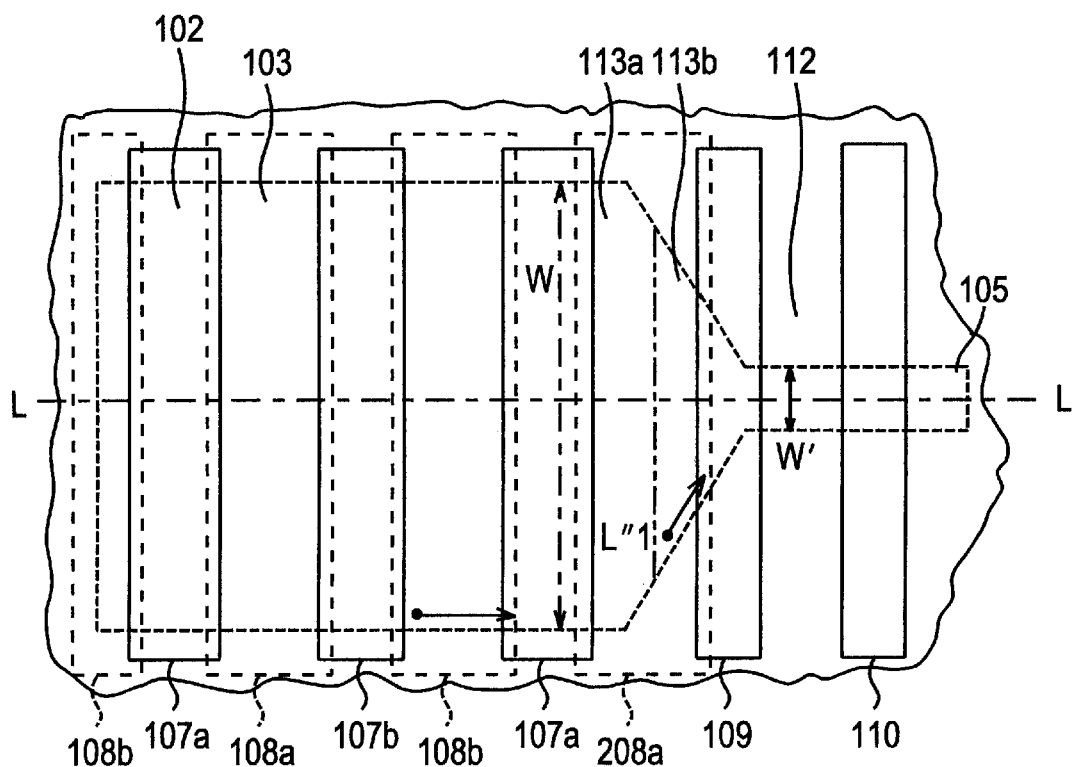
FIG. 35 is a plan view showing yet another charge transfer device according to the present invention.
Figure 36:
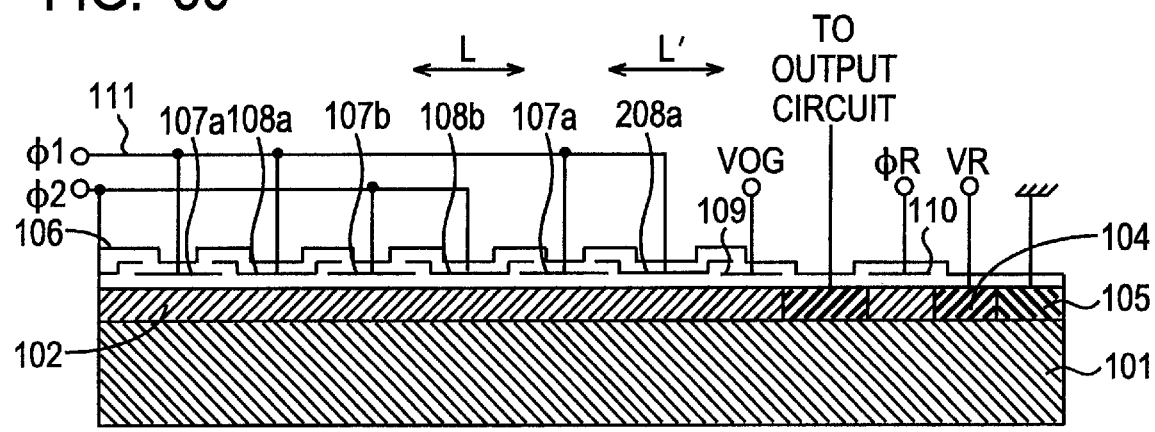
FIG. 36 is a cross sectional view taken along line L—L of FIG. 35 and showing the structure of the charge transfer device.
Figure 37A:
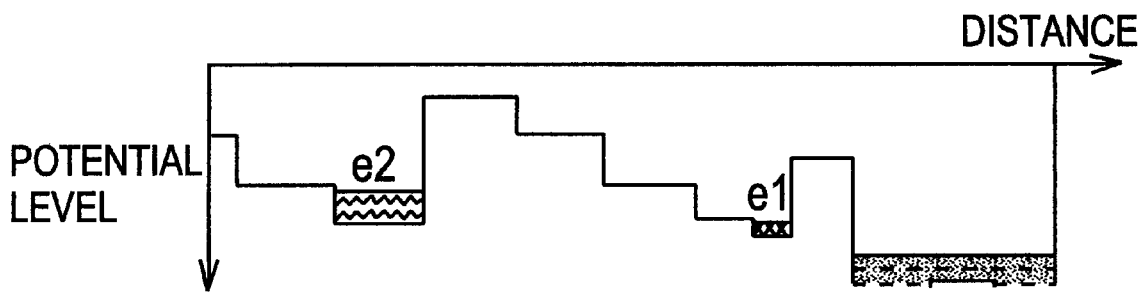
FIGS. 37A to 37C are graphs showing potential wells varied during the transfer of charge packets.
Figure 37B:
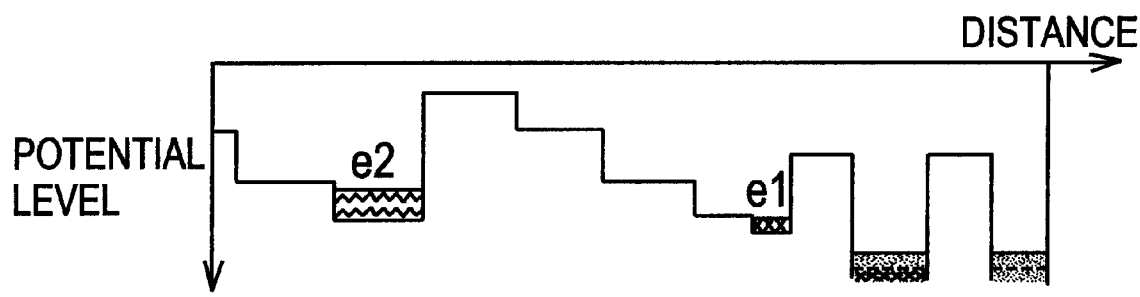
Figure 37C:
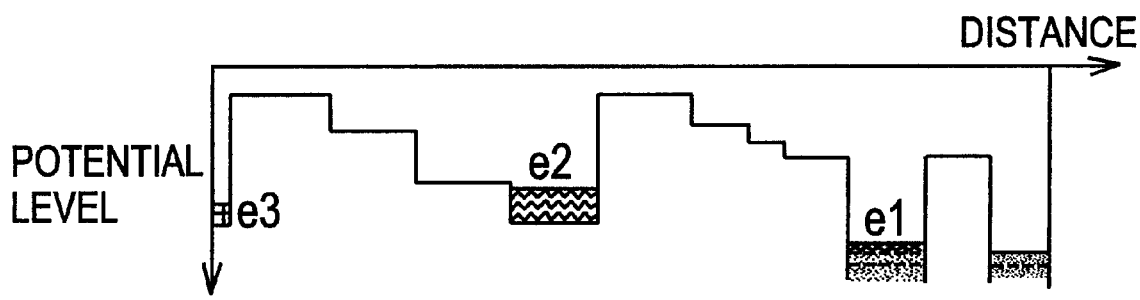

A part of the charge transfer electrode 208a closer to the gate electrode 109 may be shallower than the remaining part of the charge transfer electrode 208a closer to the charge transfer electrode 207a as shown in FIGS. 35 and 36. In this instance, the n-type impurity sub-regions 340 and 341 may be equal in dopant concentration to the lightly-doped n-type impurity region 102. As shown in FIGS. 37A to 37C, the charge packets e1, e2 and e3 are stepwise transferred through the potential wells to the floating diffusion region 112.

Three-layered electrodes may be incorporated in a charge transfer device according to the present invention.

The above-described charge transfer devices are of a buried type. The present invention is applicable to a surface type charge transfer device.

A charge transfer region may be doped with a p-type dopant impurity.

What is claimed is:

1. A charge transfer device for conveying charge packets, comprising:
    a floating diffusion region having a first width, and varied in potential level depending upon the amount of electric charge forming each of said charge packets;
    a charge transfer region including
        a transfer sub-region having a second width greater than said first width, and
        a boundary sub-region faced to said floating diffusion region and decreased from said second width to said first width;
    plural charge transfer electrodes capacitively coupled to said transfer sub-region so as to create potential wells and potential barriers between said potential wells in said transfer sub-region, and responsive to a driving signal for stepwise conveying said charge packets through said potential wells; and
    a final charge transfer electrode capacitively coupled to said boundary sub-region so as to create a final potential well at a position in said boundary sub-region closer to said floating diffusion region than remaining positions of said boundary sub-region, and responsive to said driving signal for successively transferring said charge packets from one of said potential wells through said final potential well to said floating diffusion region.

2. The charge transfer device as set forth in claim 1, in which said boundary sub-region has
    a first potential barrier sub-region contiguous to said transfer sub-region and creating a first potential barrier against said charge packets,
    a first potential well sub-region faced to said floating diffusion region and creating said final potential well, and
    an intermediate sub-region located between said first potential barrier sub-region and said first potential well sub-region.

3. The charge transfer device as set forth in claim 2, in which said intermediate sub-region is larger in dopant concentration than said first potential barrier sub-region, and is smaller in dopant concentration than said first potential well sub-region.

4. The charge transfer device as set forth in claim 3, in which a second potential barrier is created in said intermediate sub-region against said charge packets so that each of said charge packets is accumulated in said final potential well created in said first potential well sub-region.

5. The charge transfer device as set forth in claim 3, in which an additional potential well shallower than said final potential well is created in said intermediate sub-region so that most of the electric charge forming each of said charge packets is accumulated in said final potential well created in said first potential well sub-region.

6. The charge transfer device as set forth in claim 1, in which said boundary sub-region has a rectangular upper surface, and said rectangular upper surface has a third width greater than said first width and less than said second width.

7. The charge transfer device as set forth in claim 6, in which said boundary sub-region has
   a first potential barrier sub-region contiguous to said transfer sub-region and creating a first potential barrier against said charge packets,
   a first potential well sub-region faced to said floating diffusion region and serving as said position for creating said final potential well, and
   an intermediate sub-region located between said first potential barrier sub-region and said first potential well sub-region.

8. The charge transfer device as set forth in claim 7, in which a second potential barrier is created in said intermediate sub-region against said charge packets so that each of said charge packets is accumulated in said final potential well created in said first potential well sub-region.

9. The charge transfer device as set forth in claim 1, in which said boundary sub-region has a trapezoidal upper surface, which has a short end line and a long end line parallel to said short end line and closer to said floating diffusion region than said short end line.

10. The charge transfer device as set forth in claim 9, in which said boundary sub-region has
    a first potential barrier sub-region contiguous to said transfer sub-region and creating a first potential barrier against said charge packets,
    a first potential well sub-region faced to said floating diffusion region and serving as said position for creating said final potential well, and
    an intermediate sub-region located between said first potential barrier sub-region and said first potential well sub-region.

11. The charge transfer device as set forth in claim 10, in which a second potential barrier is created in said intermediate sub-region against said charge packets so that each of said charge packets is accumulated in said final potential well created in said first potential well sub-region.

12. The charge transfer device as set forth in claim 1, in which said boundary sub-region has a triangle upper surface, which has a base line faced to said floating diffusion region and a vertex closer to said transfer sub-region than said base line.

13. The charge transfer device as set forth in claim 12, in which said boundary sub-region has
    a first potential barrier sub-region contiguous to said transfer sub-region and creating a first potential barrier against said charge packets,
    a first potential well sub-region faced to said floating diffusion region and serving as said position for creating said final potential well, and
    an intermediate sub-region located between said first potential barrier sub-region and said first potential well sub-region.

14. The charge transfer device as set forth in claim 13, in which a second potential barrier is created in said intermediate sub-region against said charge packets so that each of said charge packets is accumulated in said final potential well created in said first potential well sub-region.

15. The charge transfer device as set forth in claim 1, in which said boundary sub-region has a semi-elliptical upper surface, which has a straight line faced to said floating diffusion region.

16. The charge transfer device as set forth in claim 15, in which said boundary sub-region has
    a first potential barrier sub-region contiguous to said transfer sub-region and creating a first potential barrier against said charge packets,
    a first potential well sub-region faced to said floating diffusion region and serving as said position for creating said final potential well, and
    an intermediate sub-region located between said first potential barrier sub-region and said first potential well sub-region.

17. The charge transfer device as set forth in claim 16, in which a second potential barrier is created in said intermediate sub-region against said charge packets so that each of said charge packets is accumulated in said final potential well created in said first potential well sub-region.

18. The charge transfer device as set forth in claim 1, further comprising a dielectric layer formed on said transfer sub-region and said boundary sub-region, and said plural charge transfer electrodes and said final charge transfer electrode are formed in said dielectric layer.

19. The charge transfer device as set forth in claim 18, in which said dielectric layer has a first thickness measured between the charge transfer electrodes of said plural charge transfer electrodes over said potential wells and said transfer sub-region assigned to said potential wells and a second thickness measured between the charge transfer electrodes of said plural charge transfer electrodes over said potential barriers and said transfer sub-region assigned to said potential barriers, and said first thickness is greater than said second thickness.

20. The charge transfer device as set forth in claim 18, in which said plural charge transfer electrodes are divided into a first electrode group and a second electrode group, the charge transfer electrodes of said first electrode group is alternated the charge transfer electrodes of said second electrode group so as to form charge transfer electrode pairs each consisting of one of said charge transfer electrodes of said first electrode group and adjacent one of said charge transfer electrodes of said second electrode group, and said driving signal has a first phase clock applied to every other charge transfer electrode pair and a second phase clock applied to the remaining charge transfer electrode pairs.

21. The charge transfer device as set forth in claim 20, in which said charge transfer electrodes of said first group and said charge transfer electrodes of said second group are equally spaced from-said charge transfer region.

22. The charge transfer device as set forth in claim 20, in which said charge transfer electrodes of said first electrode group and said charge transfer electrodes of said second electrode group are differently spaced from said charge transfer region.

23. The charge transfer device as set forth in claim 18, in which said plural charge transfer electrodes are divided into a first electrode group and a second electrode group, the charge transfer electrodes of said first electrode group are alternated with the charge transfer electrodes of said second electrode group, and said driving signal has a first phase clock applied to said charge transfer electrodes of said first electrode group and a second phase clock applied to said charge transfer electrodes of said second electrode group.

24. The charge transfer device as set forth in claim 2, in which said transfer sub-region includes
    second potential barrier sub-regions creating said potential barriers against said charge packets, respectively, and
    second potential well sub-regions alternated with said second potential barrier sub-regions and respectively creating said potential wells for accumulating said charge packets, one of said second potential well sub-regions being contiguous to said first potential barrier sub-region.

25. The charge transfer device as set forth in claim 24, in which said second potential well sub-regions are larger in dopant concentration than said second potential barrier sub-regions.

26. The charge transfer device as set forth in claim 25, in which said second potential well sub-regions are smaller in dopant concentration than said first potential well sub-region and larger in dopant concentration than said intermediate sub-region, and said second potential barrier sub-regions are smaller in dopant concentration than said intermediate sub-region.

27. The charge transfer device as set forth in claim 25, in which said second potential well sub-regions and said second potential barrier sub-regions are equal in dopant concentration to said intermediate sub-region and said first potential barrier sub-region, respectively, and said first potential well sub-region is larger in dopant concentration than said intermediate sub-region.

28. The charge transfer device as set forth in claim 25, in which said second potential barrier sub-regions and said second potential well sub-regions are equal in dopant concentration to said first potential barrier sub-region and said first potential well sub-region, respectively, and said intermediate sub-region is larger in dopant concentration than said first potential barrier sub-region and smaller in dopant concentration than said first potential well sub-region.

29. The charge transfer device as set forth in claim 18, further comprising a potential barrier region located between said boundary sub-region and said floating diffusion region, and a first gate electrode supplied with a constant potential level and creating a constant potential barrier against said charge packets between said final potential well and said floating diffusion region, said first potential well having a bottom edge of the conduction band changed between a first energy level higher than the bottom edge of the conduction band in said potential barrier region and a second energy level lower than the bottom edge of said conduction band in said potential barrier region in response to said driving signal.

30. The charge transfer device as set forth in claim 29, further comprising a drain region located on the opposite side to said potential barrier region with respect to said floating diffusion region and connected to a source of reset level, and a reset electrode formed in said dielectric layer over a region between said floating diffusion region and said drain region and responsive to a reset signal for discharging said each of said charge packets from said floating diffusion region to said drain region.

* * * * *